(12) United States Patent
Brar et al.

(10) Patent No.: US 7,541,640 B2
(45) Date of Patent: Jun. 2, 2009

(54) VERTICAL FIELD-EFFECT TRANSISTOR AND METHOD OF FORMING THE SAME

(75) Inventors: Berinder P. S. Brar, Newbury Park, CA (US); Wonill Ha, Thousand Oaks, CA (US)

(73) Assignee: Flextronics International USA, Inc., San Jose, CA (US)

( * ) Notice: Subject to any disclaimer, the term of this patent is extended or adjusted under 35 U.S.C. 154(b) by 65 days.

(21) Appl. No.: 11/765,324

(22) Filed: Jun. 19, 2007

(65) Prior Publication Data

US 2007/0296028 A1   Dec. 27, 2007

Related U.S. Application Data

(60) Provisional application No. 60/815,479, filed on Jun. 21, 2006.

(51) Int. Cl.
*H01L 29/732* (2006.01)
(52) U.S. Cl. .............. 257/329; 257/476; 257/E29.262; 438/212; 438/268
(58) Field of Classification Search ................ 257/135, 257/155, 213, 220, 277, 279, 280, 284, 327, 257/328, 329, 401, 442, 453, 454, 471, 473, 257/476, 477, 478, 609, 743, E21.374, E21.414, 257/E21.418, E21.429, E29.257, E29.262, 257/E29.271, E31.065, E21.45, E29.338; 438/212, 268, 269
See application file for complete search history.

(56) References Cited

U.S. PATENT DOCUMENTS 4,499,481 A   2/1985   Greene (Continued)

FOREIGN PATENT DOCUMENTS

EP   1 256 985 A2   11/2002

(Continued)

OTHER PUBLICATIONS

Bergman, J., "Development of Indium Arsenide Quantum Well Electronic Circuits: A Dissertation Presented to the Academic Faculty," http://smartech.gatech.edu/bitstream/1853/5033/1/bergman_joshua_i_200407_phd.pdf, Jul. 2004, 225 pp., Georgia Institute of Technology, Atlanta, GA.

(Continued)

*Primary Examiner*—Matthew C Landau
*Assistant Examiner*—Yosef Gebreyesus
(74) *Attorney, Agent, or Firm*—Slater & Matsil, L.L.P.

(57) ABSTRACT

A semiconductor device, a method of forming the same, and a power converter including the semiconductor device. In one embodiment, the semiconductor device includes a heavily doped substrate, a source/drain contact below the heavily doped substrate, and a channel layer above the heavily doped substrate. The semiconductor device also includes a heavily doped source/drain layer above the channel layer and another source/drain contact above the heavily doped source/drain layer. The semiconductor device further includes pillar regions through the another source/drain contact, the heavily doped source/drain layer, and portions of the channel layer to form a vertical cell therebetween. Non-conductive regions of the semiconductor device are located in the portions of the channel layer within the pillar regions. The semiconductor device still further includes a gate above the non-conductive regions in the pillar regions. The semiconductor device may also include a Schottky diode including the channel layer and a Schottky contact.

30 Claims, 23 Drawing Sheets

U.S. PATENT DOCUMENTS

| | | | |
|---|---|---|---|
| 4,570,174 A | 2/1986 | Huang et al. | |
| 4,636,823 A | 1/1987 | Margalit et al. | |
| 4,807,022 A | 2/1989 | Kazior et al. | |
| 4,839,310 A * | 6/1989 | Hollis et al. | 438/173 |
| 4,903,089 A | 2/1990 | Hollis et al. | |
| 4,967,243 A | 10/1990 | Baliga et al. | |
| 5,055,889 A * | 10/1991 | Beall | 257/277 |
| 5,068,756 A | 11/1991 | Morris et al. | |
| 5,106,778 A | 4/1992 | Hollis et al. | |
| 5,126,701 A | 6/1992 | Adlerstein | |
| 5,126,714 A | 6/1992 | Johnson | |
| 5,223,449 A | 6/1993 | Morris et al. | |
| 5,231,037 A | 7/1993 | Yuan et al. | |
| 5,244,829 A | 9/1993 | Kim | |
| 5,292,686 A | 3/1994 | Riley et al. | |
| 5,342,795 A | 8/1994 | Yuan et al. | |
| 5,343,071 A | 8/1994 | Kazior et al. | |
| 5,369,042 A | 11/1994 | Morris et al. | |
| 5,374,887 A | 12/1994 | Drobnik | |
| 5,407,842 A | 4/1995 | Morris et al. | |
| 5,468,661 A | 11/1995 | Yuan et al. | |
| 5,554,561 A | 9/1996 | Plumton | |
| 5,555,494 A | 9/1996 | Morris | |
| 5,610,085 A | 3/1997 | Yuan et al. | |
| 5,624,860 A | 4/1997 | Plumton et al. | |
| 5,700,703 A | 12/1997 | Huang et al. | |
| 5,712,189 A | 1/1998 | Plumton et al. | |
| 5,747,842 A | 5/1998 | Plumton | |
| 5,756,375 A | 5/1998 | Celii et al. | |
| 5,783,984 A | 7/1998 | Keuneke | |
| 5,784,266 A | 7/1998 | Chen | |
| 5,804,943 A | 9/1998 | Kollman et al. | |
| 5,889,298 A | 3/1999 | Plumton et al. | |
| 5,909,110 A | 6/1999 | Yuan et al. | |
| 5,910,665 A | 6/1999 | Plumton et al. | |
| 5,920,475 A | 7/1999 | Boylan et al. | |
| 5,956,245 A | 9/1999 | Rozman | |
| 5,956,578 A | 9/1999 | Weitzel et al. | |
| 6,008,519 A | 12/1999 | Yuan et al. | |
| 6,038,154 A | 3/2000 | Boylan et al. | |
| 6,094,038 A | 7/2000 | Lethellier | |
| 6,097,046 A | 8/2000 | Plumton | |
| 6,156,611 A | 12/2000 | Lan et al. | |
| 6,181,231 B1 | 1/2001 | Bartilson | |
| 6,191,964 B1 | 2/2001 | Boylan et al. | |
| 6,208,535 B1 | 3/2001 | Parks | |
| 6,218,891 B1 | 4/2001 | Lotfi et al. | |
| 6,229,197 B1 | 5/2001 | Plumton et al. | |
| 6,309,918 B1 | 10/2001 | Huang et al. | |
| 6,323,090 B1 | 11/2001 | Zommer | |
| 6,348,848 B1 | 2/2002 | Herbert | |
| 6,362,986 B1 | 3/2002 | Schultz et al. | |
| 6,477,065 B2 * | 11/2002 | Parks | 363/21.06 |
| 6,483,724 B1 | 11/2002 | Blair et al. | |
| 6,525,603 B1 | 2/2003 | Morgan | |
| 6,549,436 B1 | 4/2003 | Sun | |
| 6,661,276 B1 | 12/2003 | Chang | |
| 6,741,099 B1 | 5/2004 | Krugly | |
| 6,775,159 B2 | 8/2004 | Webb et al. | |
| 6,855,970 B2 * | 2/2005 | Hatakeyama et al. | 257/264 |
| 6,873,237 B2 | 3/2005 | Chandrasekaran et al. | |
| 6,980,077 B1 | 12/2005 | Chandrasekaran et al. | |
| 7,012,414 B1 | 3/2006 | Mehrotra et al. | |
| 7,046,523 B2 | 5/2006 | Sun et al. | |
| 7,176,662 B2 | 2/2007 | Chandrasekaran | |
| 7,285,807 B2 | 10/2007 | Brar et al. | |
| 7,321,283 B2 | 1/2008 | Mehrotra et al. | |
| 7,339,208 B2 | 3/2008 | Brar et al. | |
| 2002/0121647 A1 | 9/2002 | Taylor | |
| 2003/0032231 A1 * | 2/2003 | Efland et al. | 438/200 |
| 2003/0198067 A1 | 10/2003 | Sun et al. | |
| 2005/0024179 A1 | 2/2005 | Chandrasekaran et al. | |
| 2005/0104080 A1 | 5/2005 | Ichihara et al. | |
| 2006/0011924 A1 * | 1/2006 | Mazzola et al. | 257/77 |
| 2006/0038650 A1 | 2/2006 | Mehrotra et al. | |
| 2006/0060871 A1 * | 3/2006 | Beach | 257/94 |
| 2006/0118824 A1 | 6/2006 | Otsuka et al. | |
| 2006/0187684 A1 | 8/2006 | Chandrasekaran et al. | |
| 2006/0197510 A1 | 9/2006 | Chandrasekaran | |
| 2006/0198173 A1 | 9/2006 | Rozman | |
| 2006/0208279 A1 | 9/2006 | Robinson et al. | |
| 2006/0226477 A1 | 10/2006 | Brar et al. | |
| 2006/0226478 A1 | 10/2006 | Brar et al. | |
| 2006/0231841 A1 * | 10/2006 | Okuno et al. | 257/66 |
| 2006/0255360 A1 | 11/2006 | Brar et al. | |
| 2007/0045765 A1 | 3/2007 | Brar et al. | |
| 2007/0069286 A1 | 3/2007 | Brar et al. | |
| 2007/0108538 A1 * | 5/2007 | Koyama | 257/412 |
| 2007/0145417 A1 | 6/2007 | Brar et al. | |
| 2007/0187717 A1 | 8/2007 | Sadaka et al. | |

FOREIGN PATENT DOCUMENTS

| | | |
|---|---|---|
| EP | 1 638 147 A2 | 3/2006 |
| WO | WO 2005/015642 A1 | 2/2005 |

OTHER PUBLICATIONS

"Advanced Synchronous Rectified Buck MOSFET Drivers with Pre-POR OVP," ISL6612A, ISL6613A, Data Sheet FN9159.6, Jul. 27, 2006, 12 pp., Intersil Americas Inc., Milpitas, CA.

Asano, K., et al., "Novel High Power AlGaAs/GaAs HFET with a Field-Modulating Plate Operated at 35V Drain Voltage," IEDM 98, 1998, pp. 59-62, IEEE, Los Alamitos, CA.

Berroth, M., et al., "Extreme Low Power 1:4 Demultiplexer Using Double Delta Doped Quantum Well GaAs/AlGaAs Transistors," Japanese Journal of Applied Physics, Extended Abstracts of the 22nd 1990 International Conference on Solid State Devices and Materials, 1990, pp. 75-78, Tokyo, Japan.

Eisenbeiser, K., et al., "Manufacturable GaAs VFET for Power Switching Applications," IEEE Electron Device Letters, Apr. 2000, pp. 144-145, vol. 21, No. 4, IEEE, Los Alamitos, CA.

Kollman, R., et al., "10 MHz PWM Converters with GaAs VFETs," IEEE Eleventh Annual Applied Power Electronics Conference and Exposition, Mar. 1996, pp. 264-269, vol. 1, IEEE, Los Alamitos, CA.

Lan, E., et al., "A Field Plate Device by Self-Aligned Spacer Process," The International Conference on Compound Semiconductor Manufacturing Technology, 2004, pp. 35-38, GaAs Mantech, St. Louis, MO.

Lui, W., "Fundamentals of III-V Devices: HBTs, MESFETs, and HFETs/HEMTs," §5-5: Modulation Doping, 1999, pp. 323-330, John Wiley & Sons, New York, NY.

Nguyen, L.D., et al., "Ultra-High-Speed Modulation-Doped Field-Effect Transistors: A Tutorial Review," Proceedings of the IEEE, Apr. 1992, pp. 494-518, vol. 80, No. 4, IEEE, Los Alamitos, CA.

Niemela, V.A., et al., "Comparison of GaAs and Silicon Synchronous Rectifiers in a 3.3V Out, 50W DC-DC Converter," 27th Annual, IEEE Power Electronics Specialists Conference, Jun. 1996, pp. 861-867, vol. 1, IEEE, Los Alamitos, CA.

Plumton, D.L., et al., "A Low On-Resistance High-Current GaAs Power VFET," IEEE Electron Device Letters, Apr. 1995, pp. 142-144, vol. 16, No. 4, IEEE, Los Alamitos, CA.

Sickmiller, M., "Packaging of Ultrathin Semiconductor Devices Through the ELO Packaging Process," Mat. Res. Soc. Symp. Proc., 2001, pp. 17.3.1-17.3.6, vol. 681E, Materials Research Society, Warrendale, PA.

Tkachenko, Y., et al., "Improved Breakdown Voltage and Hot-Electron Reliability PHEMT for High Efficiency Power Amplifiers," Asia Pacific Microwave Conference (AMPC'99), Nov. 30, 1999, pp. 618-621, vol. 3, IEEE, Los Alamitos, CA.

Weitzel, C.E., "RF Power Devices for Wireless Communications," 2002 IEEE MTT-S CDROM, 2002, pp. 285-288, paper TU4B-1, IEEE, Los Alamitos, CA.

Williams, R., "Modern GaAs Processing Methods," 1990, pp. 66-67, Artech House, Inc., Norwood, MA.

Wu, C.S., et al., "Pseudomorphic HEMT Manufacturing Technology for Multifunctional Ka-Band MMIC Applications," IEEE Transactions on Microwave Theory and Techniques, Feb. 1995, pp. 257-265, vol. 43. No. 2, IEEE, New York, US.

Storm, D.F., et al., "Reduction of Buffer Layer Conduction Near Plasma-Assisted Molecular-Beam Epitaxy Grown GaN/AlN Interfaces by Beryllium Doping," Applied Physics Letters, Nov. 11, 2002, pp. 3819-3821, vol. 81, No. 20, American Institute of Physics, Melville, NY.

Ajit, J.S., "Design of MOS-Gated Bipolar Transistors with Integral Antiparallel Diode," IEEE Electron Device Letters, pp. 344-347, Jul. 1996, vol. 17, Issue 7, IEEE, Los Alamitos, CA.

Peppel, M., et al., "Optimized Reverse Diode Operation of Power MOSFETs," 2000 IEEE Industry Applications Conference, Oct. 8, 2000, pp. 2961-2965, vol. 5, IEEE, Los Alamitos, CA.

* cited by examiner

ND METHOD OF FORMING THE SAME

VERTICAL FIELD-EFFECT TRANSISTOR AND METHOD OF FORMING THE SAME

This application claims the benefit of U.S. Provisional Application No. 60/815,479, entitled "Vertical Field-Effect Transistor and Method of Forming the Same," filed on Jun. 21, 2006, which is incorporated herein by reference.

TECHNICAL FIELD

The present invention is directed, in general, to a compound semiconductor device and, more specifically, to a compound semiconductor device including a vertical field-effect transistor, a method of forming the same, and a power supply including a compound semiconductor device including a vertical field-effect transistor.

BACKGROUND

A field-effect transistor (also referred to as a "FET") is a conventional semiconductor device employable in switch-mode power supplies (also referred to as "power converters") for use in data processing and telecommunication systems as well as for other applications that use conditioned power for the operation of sensitive electronic circuits. Field-effect transistors have almost universally replaced bipolar transistors previously used for inverters (a type or portion of a power supply) as well as the p-n and Schottky diodes used for rectification. The proliferation of field-effect transistors has, at least in part, been driven by the need to provide highly efficient power supplies with low dc output voltages such as five volts or less at higher current levels. The broad acceptance of field-effect transistors for the aforementioned applications is a consequence of the low forward voltage drop and fast switching speed as well as the low power consumption employed to enable or disable conduction thereof. As a result, the use of field-effect transistors has contributed to compact and efficient power supplies that can be produced at low cost.

As the loads for the power supplies are generally designed with integrated circuits employing shrinking feature sizes for the circuit elements, a need is continually evolving for new designs with lower output voltages (e.g., one volt or less) at higher current levels (e.g., 50 to 100 amperes or more). Present switch-mode power supplies providing input-output circuit isolation (via a transformer) and employing silicon-based field-effect transistors as synchronous rectifiers therein and designed with best current practice are usually operable with switching frequencies only up to several hundred kilohertz ("kHz") due, at least in part, to the slower switching speeds of the silicon-based field-effect transistors. To accommodate continuing developments in integrated circuit technology, however, power supply switching frequencies above one megahertz ("MHz") are desirable to reduce the size of magnetic devices and the capacitive filters of the power supply without compromising the power conversion efficiency. In accordance therewith, field-effect transistors with previously unrealizable characteristics are not only being requested, but are necessary to satisfy the aforementioned conditions.

A material of choice for high performance field-effect transistors is a semiconductor with high electron mobility and wide band gap for high breakdown voltage that is capable of being processed with conventional equipment and methods not substantially different from those already developed for silicon and present generations of compound semiconductors. A particularly desirable material is the compound semiconductor known as gallium arsenide ("GaAs"), which has been used for integrated circuits operable at frequencies well above one gigahertz, and which has been used to produce power field-effect transistors with high performance characteristics. An exemplary performance of gallium arsenide in comparison to other semiconductor materials for high performance field-effect transistors is described in "Fundamentals of III-V Devices" by W. Liu, published by John Wiley and Sons (1999), and "Modern GaAs Processing Methods" by R. Williams, published by Artech House (1990), which are incorporated herein by reference.

Additionally, examples of gallium arsenide field-effect transistors employing a controllable vertical channel between a source and drain thereof are provided in the following references, namely, U.S. Pat. No. 5,889,298 entitled "Vertical JFET Field Effect Transistor," by Plumton, et al., issued on Mar. 30, 1999, U.S. Pat. No. 5,342,795 entitled "Method of Fabricating Power VFET Gate-Refill," by Yuan, et al., issued on Aug. 30, 1994, U.S. Pat. No. 5,468,661 entitled "Method of Making Power VFET Device," by Yuan, et al., issued on Nov. 21, 1995, U.S. Pat. No. 5,610,085 entitled "Method of Making a Vertical FET using Epitaxial Overgrowth," by Yuan, et al., issued on Mar. 11, 1997, and U.S. Pat. No. 5,624,860 entitled "Vertical Field Effect Transistor and Method," by Plumton, et al., issued on Apr. 29, 1997, which are incorporated herein by reference.

An exemplary gallium arsenide field-effect transistor as generally described in the aforementioned references is illustrated with respect to FIG. 1. The gallium arsenide field-effect transistor includes buried and inter-coupled gate fingers (also referred to as a gate and one of which is designated 110) formed in etched trenches in an n-doped drain 120 thereby producing vertical channels 130. The gates 110 exhibit a gate length (generally designated "GL") and the vertical channels 130 provide a channel opening (generally designated "CO"). The trenches are back-filled epitaxially with p-doped gallium arsenide to form the gates 110. A p+ implant 140 provides a top surface contact to the gates 110, and is made through a further n-doped epitaxial layer that forms a source 150. External connection to the gates 110 is made through metallized contacts 160 deposited over the heavily doped p+ implants 140. An external source contact 170 and drain contact 180 are made through metal depositions over further heavily doped areas. The structure produces vertical field-effect transistor channels between the gates 110, and provides source and drain contacts 170, 180, respectively, on opposing sides of the die. The device, therefore, operates with vertical carrier flow and the buried gates 110, typically doped opposite from the vertical channels 130, exhibiting substantial gate resistance that limits a switching speed thereof.

This design methodology of constructing such gallium arsenide field-effect transistors has been analyzed in the following references, namely, "Comparison of GaAs and Silicon Synchronous Rectifiers in a 3.3V Out, 50W DC-DC Converter," by V. A. Niemela, et al., 27th Annual, IEEE Power Electronics Specialists Conference, Vol. 1, June 1996, pp. 861-67, "10 MHz PWM Converters with GaAs VFETs," by R. Kollman, et al., IEEE Eleventh Annual Applied Power Electronics Conference and Exposition, Vol. 1, March 1996, pp. 264-69, "A Low On-Resistance High-Current GaAs Power VFET," by D. L. Plumton, et al., IEEE Electron Device Letters, Vol. 16, Issue 4, April 1995, pp. 142-44, and "RF Power Devices for Wireless Communications," by C. E. Weitzel, IEEE MTT-S2002, paper TU4B-1, which are incorporated herein by reference. The structure as generally described in the aforementioned references has higher channel and gate resistance per unit die area than the desired resistance and produces a device operable only in the depletion mode, which may limit the applicability of the device in certain situations. The resulting cost and performance, particularly the manufacturing cost to grow the necessary device structures in regions around and including buried gates, have resulted in limited marketability in view of the presently available silicon-based technology.

Another example of a vertical channel gallium arsenide field-effect transistor is described in "Manufacturable GaAs VFET for Power Switching Applications," by K. Eisenbeiser, et al., IEEE Electron Device Letters, Vol. 21, No. 4, pp. 144-45 (April 2000), which is incorporated herein by reference. The reference describes forming a source contact on a top surface of the die and a drain contact on the bottom. Although economies of manufacture are achieved using implants rather than etching and epitaxial growth as described by Eisenbeiser, et al., possible disadvantages of a channel so formed adjacent to a buried semiconductor gate structure limit the switching speed and operation as an enhancement-mode device.

R. Williams describes a GaAs power field-effect transistor in "Modern GaAs Processing Methods," incorporating both the source and drain contacts on the upper side of a die with a lateral channel and is illustrated with respect to FIG. 2A. The gallium arsenide field-effect transistor acting as a power field-effect transistor includes a gate 205 interposed between a source 210 and drain 215, creating a lateral channel in an n-doped GaAs layer 220. A depletion region 225 is formed under the gate 205 and a shallower depletion region 230 forms generally under an upper surface of the die as a result of an inherent existence of surface states at the surface of the crystal (i.e., a surface pinning effect). The gallium arsenide field-effect transistor is formed over a semi-insulating GaAs substrate 235. Designing the source and drain contacts on the same surface of the die requires a complicated multilayer metallization process and results in increased die area and reduced chip yield. The aforementioned configuration can also lead to increased inductance, which is of significance in applications for microwave signal amplification.

Another gallium arsenide field-effect transistor is described by R. Williams at pp. 66-67 of "Modern GaAs Processing Methods," which is formed with source and drain contacts on opposing sides of the die and a lateral channel, and is illustrated with respect to FIG. 2B. The gallium arsenide field-effect transistor includes a plated air bridge 250 coupled to a source (generally designated "S") on an upper side of the die. Gates (generally designated "G") are interposed between drains (generally designated "D"), and are also located on the upper surface of the die. Couplings to the source are brought down to a lower surface of the die by vias 265 that are plated-through holes between the lower surface and the source and are further coupled together by a plated heat sink 280. Although this arrangement can provide low-inductance external connections to the source, it is limited in its ability to provide a low-resistance channel tightly coupled to the lower surface of a highly conductive substrate.

The aforementioned design also does not accommodate large drain contacts desirable for a higher power device, which will increase the resistive and inductive losses. This configuration requires a complex air-bridge processing step, which will increase the cost and potentially affect the reliability of the device. For the large gate width field-effect transistor, the parasitic resistance in series with the source will increase due to the long air-bridge connection. This design also is incompatible with today's packaging techniques for higher power devices embodied in a vertical device configuration.

Additionally, U.S. Pat. No. 6,309,918 entitled "Manufacturable GaAs VFET Process," by Huang, et al., issued on Oct. 30, 2001, is directed toward a vertical FET with source and drain contacts on opposing sides of a die. U.S. Pat. No. 5,956,578 entitled "Method of Fabricating Vertical FET with Schottky Diode," by Weitzel, et al., issued on Sep. 21, 1999, and U.S. Pat. No. 6,097,046 entitled "Vertical Field Effect Transistor and Diode," by Plumton, issued on Aug. 1, 2000, are directed toward a vertical FET on a compound semiconductor substrate. Neither of the aforementioned references, which are also incorporated herein by reference, provides sufficiently low on-resistance, or a gate with sufficiently low gate resistance to provide the necessary switching speed and low switching losses demanded by new applications.

Still further references such as U.S. Pat. No. 5,068,756 entitled "Integrated Circuit Composed of Group III-V Compound Field Effect and Bipolar Semiconductors," by Morris, et al., issued on Nov. 26, 1991, and U.S. Pat. No. 5,223,449 entitled "Method of Making an Integrated Circuit Composed of Group III-V Compound Field Effect and Bipolar Semiconductors," by Morris, et al., issued on Jun. 29, 1993, which are incorporated herein by reference, describe an integration of multiple semiconductor devices on a die including n- and p-channel junction field-effect transistors with a lateral channel. These devices include an isolation trench surrounding the devices, etched to a lower semi-insulating gallium arsenide layer and backfilled with silicon nitride. The aforementioned devices, however, are formed with contacts on a top surface, which restricts their application from low voltage, high current systems wherein efficiency is an important design element.

Corresponding limitations are found in power supplies designed with power switches formed of compound semiconductor devices. Power supply design limitations resulting from the limited performance available from power switches limit power supply switching frequency, efficiency, and power conversion density, particularly in applications powering low-voltage loads that draw high currents.

Considering the limitations as described above, a field-effect transistor design is not presently available for the more severe applications that lie ahead. Accordingly, what is needed in the art is a gallium arsenide and other compound semiconductor devices with low on-resistance and a highly conductive gate structure, configured for wide acceptance, particularly in low voltage and high current applications, overcoming many of the aforementioned limitations. In accordance therewith, a compact and efficient power supply, particularly for very low voltage and high current loads such as microprocessors, as well as amplifiers for telecommunications and other applications, would benefit from a robust field-effect transistor with low on-resistance without incurring unnecessary manufacturing costs. The alternative should address a need to commit larger or additional semiconductor switching devices to achieve the necessary low, switchable resistance needed in high efficiency end devices such as power supplies and radio frequency amplifiers.

SUMMARY OF THE INVENTION

These and other problems are generally solved or circumvented, and technical advantages are generally achieved, by advantageous embodiments of the present invention, which includes a semiconductor device, a method of forming the same, and a power converter including the semiconductor device. In one embodiment, the semiconductor device includes a heavily doped substrate, a source/drain contact below the heavily doped substrate, and a channel layer above the heavily doped substrate. The semiconductor device also includes a heavily doped source/drain layer above the channel layer and another source/drain contact above the heavily doped source/drain layer. The semiconductor device further includes pillar regions through the another source/drain contact, the heavily doped source/drain layer, and portions of the channel layer to form a vertical cell therebetween. Non-conductive regions of the semiconductor device are located in the portions of the channel layer within the pillar regions. The semiconductor device still further includes a gate above the non-conductive regions in the pillar regions.

In another aspect, the semiconductor device includes a vertical field-effect transistor and a Schottky diode. The vertical field-effect transistor includes a heavily doped substrate, a source/drain contact below the heavily doped substrate, and a channel layer above the heavily doped substrate. The vertical field-effect transistor also includes a heavily doped source/drain layer above the channel layer and another source/drain contact above the heavily doped source/drain layer. The vertical field-effect transistor further includes pillar regions through the another source/drain contact, the heavily doped source/drain layer, and portions of the channel layer to form a vertical cell therebetween. Non-conductive regions of the vertical field-effect transistor are located in the portions of the channel layer within the pillar regions. The vertical field-effect transistor still further includes a gate above the non-conductive regions in the pillar regions. The Schottky diode includes a Schottky contact on an exposed surface of the channel layer to provide an anode configured to cooperate with the channel layer to provide a cathode for the Schottky diode.

In yet another aspect, the semiconductor device includes a vertical field-effect transistor and a Schottky diode. The vertical field-effect transistor includes a heavily doped substrate, a channel layer above the heavily doped substrate, a heavily doped source/drain layer above the channel layer and a source/drain contact above the heavily doped source/drain layer. The vertical field-effect transistor also includes pillar regions through the source/drain contact, the heavily doped source/drain layer, and portions of the channel layer to form a vertical cell therebetween. Non-conductive regions of the vertical field-effect transistor are located in the portions of the channel layer within the pillar regions. The vertical field-effect transistor further includes a gate above the non-conductive regions in the pillar regions. The Schottky diode includes a contact below the heavily doped substrate within the vertical cell and pillar regions and within a trench through the heavily doped substrate to the channel layer outside of the vertical cell and the pillar regions. The contact within the vertical cell and pillar regions provides another source/drain contact for the vertical field-effect transistor. The contact within the trench provides an anode configured to cooperate with the channel layer to provide a cathode for the Schottky diode.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
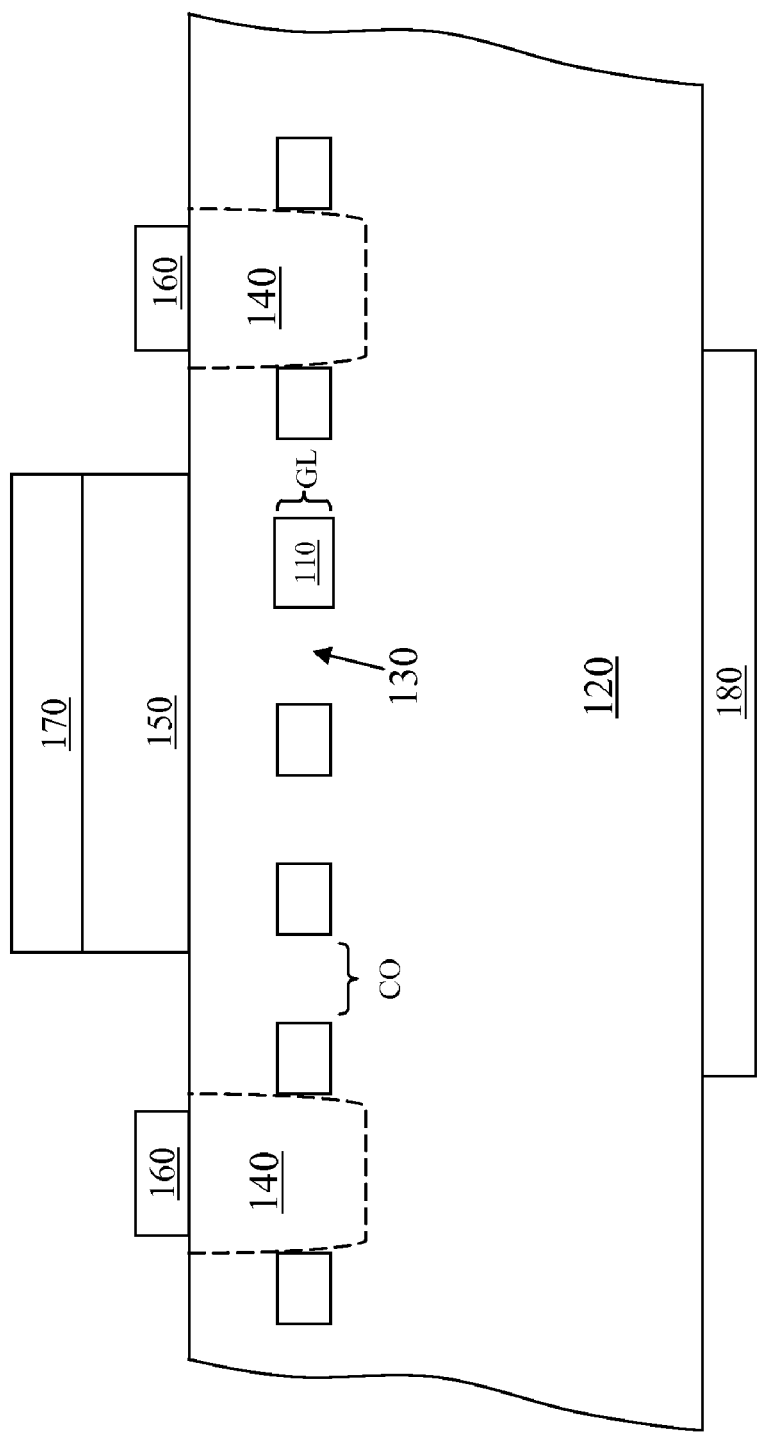
FIGS. 1, 2A, and 2B illustrate cross-sectional views of field-effect transistors according to the prior art.
Figure 2A:
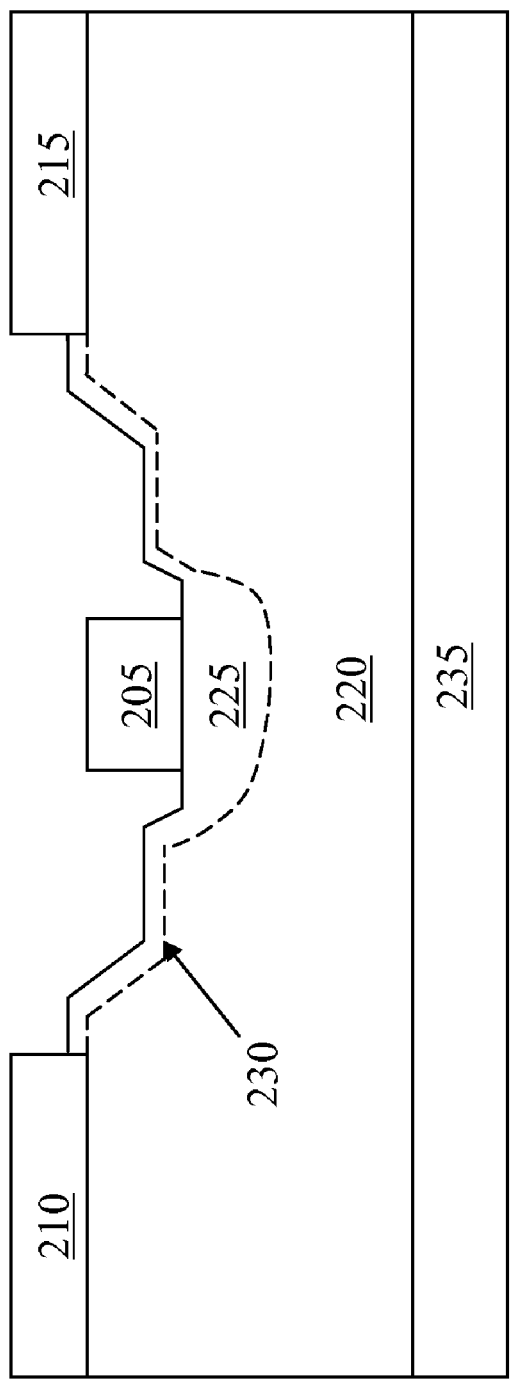
Figure 2B:
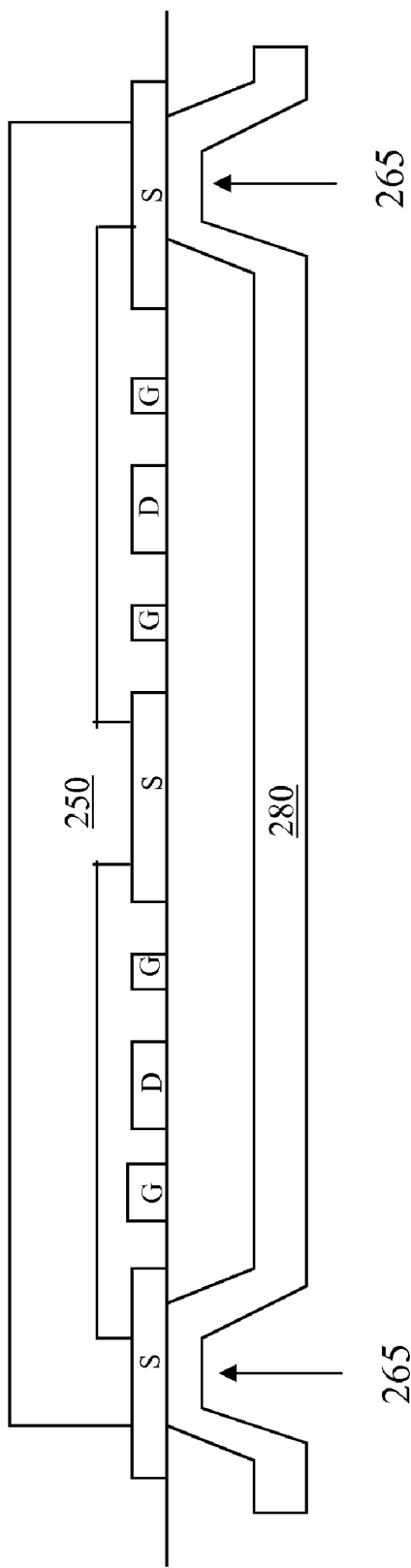

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described first with respect to exemplary embodiments in a specific context, namely, a semiconductor device and, more particularly, a semiconductor device including a vertical FET. A vertical FET is formed with a source contact formed on a substrate (e.g., a source) and a drain contact formed on an opposing surface of the semiconductor device to provide a low on-resistance switch with very fast switching transition times. A metallized gate controls a vertical channel therein. Alternatively, the positions of the source and drain may be reversed and accordingly the source and drain may be referred to as a "source/drain." The principles of the present invention may be applied to semiconductor devices having contacts on opposing surfaces thereof.

For examples of semiconductor devices employing a lateral channel, see U.S. Patent Application Publication No. 2006/0226477, entitled "Substrate Driven Field-Effect Transistor," to Brar, et al., filed Mar. 29, 2005 and published Oct. 12, 2006, U.S. Patent Application Publication No. 2006/0226478, entitled "Semiconductor Device Having a Lateral Channel and Contacts on Opposing Surfaces Thereof," to Brar, et al., filed Mar. 29, 2005 and published Oct. 12, 2006, U.S. Patent Application Publication No. 2006/0255360, entitled "Semiconductor Device Having Multiple Lateral Channels and Method of Forming the Same," to Brar, et al., filed May 13, 2005 and published Nov. 16, 2006, U.S. Patent Application Publication No. 2007/0045765, entitled "Semiconductor Device Having Substrate-Driven Field-Effect Transistor and Schottky Diode and Method of Forming the Same," to Brar, et al., filed Aug. 25, 2005 and published Mar. 1, 2007, and U.S. Patent Application Publication No. 2007/0069286, entitled "Semiconductor Device Having an Interconnect with Sloped Walls and Method of Forming the Same," to Brar, et al., filed Sep. 27, 2005 and published Mar. 29, 2007, which are incorporated herein by reference.

Additionally, for examples of power supplies that provide an environment for the vertical FET, see U.S. Patent Application Publication No. 2005/0024179, entitled "Extended E Matrix Integrated Magnetics (MIM) Core," to Chandrasekaran, et al., filed Aug. 19, 2004 and published Feb. 3, 2005, U.S. Pat. No. 6,775,159, entitled "Switching Power Converter Circuits Providing Main and Auxiliary Output Voltages," to Webb, et al., issued Aug. 10, 2004, U.S. Pat. No. 6,549,436, entitled "Integrated Magnetic Converter Circuit and Method with Improved Filtering," to Sun, issued Apr. 15, 2003, U.S. Pat. No. 7,046,523, entitled "Core Structure and Interleaved DC-DC Converter Topology," to Sun, et al., issued May 16, 2006, U.S. Pat. No. 7,012,414, entitled "Vertically Packaged Switched-Mode Power Converter," to Mehrotra, et al., issued Mar. 14, 2006, U.S. Patent Application Publication No. 2006/0187684, entitled "Power Converter Employing Integrated Magnetics with a Current Multiplier Rectifier and Method of Operating the Same," to Chandrasekaran, et al., filed Feb. 8, 2006 and published Aug. 24, 2006, U.S. Patent Application Publication No. 2006/0197510, entitled "Power Converter Employing a Tapped Inductor and Integrated Magnetics and Method of Operating the Same," to Chandrasekaran, filed Feb. 23, 2006 and published Sep. 7, 2006 (now, U.S. Pat. No. 7,176,662, issued Feb. 13, 2007), and U.S. Patent Application Publication No. 2006/0198173, entitled "Control Circuit for a Depletion Mode Switch and Method of Operating the Same," to Rozman, filed Feb. 23, 2006 and published Sep. 7, 2006, all of which are incorporated herein by reference.

The present invention will then be described including a Schottky diode formed on the same die as a vertical FET. In an advantageous embodiment, the Schottky diode is coupled to a source/drain contact of the vertical FET in an anti-parallel arrangement. The Schottky diode, coupled to a source/train contact, can advantageously operate as the body diode for the vertical FET. Exemplary power supplies (e.g., power converters) will then be described advantageously including a compound semiconductor device including a vertical FET formed according to the principles and methods of the present invention.

Exemplary characteristics and advantages associated with the use of selected embodiments of the semiconductor device including the vertical FET according to the principles of the present invention are set forth below. The vertical FET may be capable of switching transition times on the order of nanoseconds, rather than switching transition times on the order of 35 to 50 nanoseconds realizable with the present silicon-based technology. The vertical FET may exhibit peak inverse voltage ratings such as 10 to 20 volts or less, and should advantageously have low on-resistance including the parasitic electrical resistance from the device packaging approaching one milliohm or less. In addition, the vertical FET desirably has gates that can be driven with digital logic, with low gate charge and correspondingly low and controllable field-effect transistor threshold voltages. In one embodiment of the present invention, the vertical FET also desirably can be formed with current ratings of a dozen amperes or more, and should be cost competitive with presently available field-effect transistors having similar power ratings implemented in silicon-based technology.

The vertical FET having source and drain contacts on opposing sides thereof facilitates low resistance and inductance packaging by providing more area for the contacts. The vertical FET may be formed with a sufficiently high gate threshold voltage so that it can operate with substantial channel resistance with a gate-to-source voltage of substantially zero volts, permitting its application in place of an enhancement-mode device. This capability avoids short circuits during, for example, a power supply start-up. The presence of an integrated diode with a terminal or contact (e.g., an anode) coupled to a source contact can also provide substantial benefits in circuit design as well as cost reduction, particularly in applications such as a power supply.

In the drawings, boundaries may be shown as lines to separate semiconductor regions or layers with apparent abrupt changes in doping levels or species. It is recognized that semiconductor manufacturing processes such as implantation and diffusion may cause doping concentrations and atomic species to vary in a continuous and sometimes gradual manner across a semiconductor device. Consequently, graded boundaries of device regions may be shown as lines in the drawings for explanatory purposes without compromising an understanding of the structure of the devices.

Many steps conventionally used to process a gallium arsenide (also referred to as "GaAs") substrate and other compound semiconductors as described herein are well known in the art, and, in the interest of brevity, will not be described in detail. The basic steps include, for example, molecular-beam epitaxy, metal-organic chemical vapor deposition, patterning, exposing, etching, vacuum depositing, plating, doping, alloying, annealing, and cleaning. For reference purposes, R. Williams describes many conventional processes for constructing a gallium arsenide device in "Modern GaAs Processing Methods." Additionally, several separate processing steps may be generally combined into a single step within the scope of the present invention, such as a combined annealing step wherein a number of alloys that are separately deposited are heated together to jointly activate the alloys. Further, alternative methods to perform a processing step such as vacuum deposition, sputtering, or plating processes may be combined or performed separately without further elaboration herein. Also, while selected doping levels and characteristics such as thickness of layers that make up an exemplary semiconductor device will hereinafter be provided, those skilled in the art understand that alternative doping levels and characteristics may be provided and still be within the broad scope of the present invention. For instance and in the appropriate circumstances, the layers may be oppositely doped, such as a p-type layer may be replaced with an n-type layer.

Figure 3:
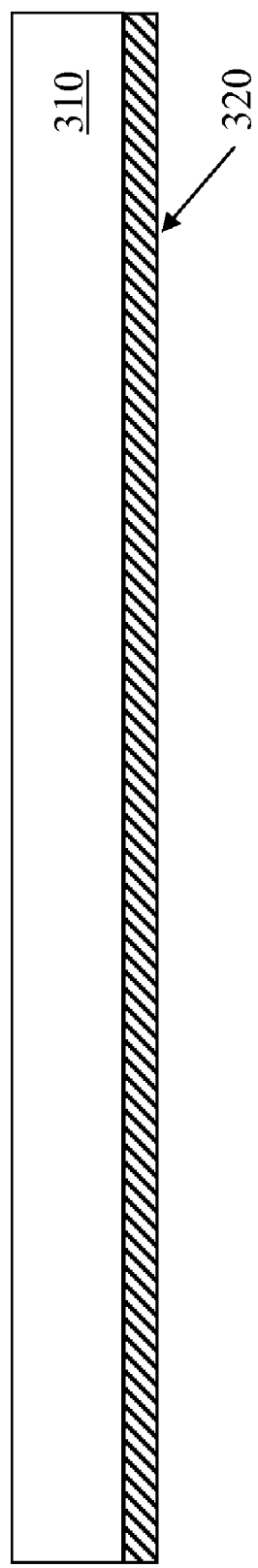
FIGS. 3 to 20 illustrate cross-sectional views of an embodiment of constructing a semiconductor device according to the principles of the present invention.

Referring now to FIGS. 3 to 20, illustrated are cross-sectional views of an embodiment of constructing a semiconductor device including a vertical FET according to the principles of the present invention. Beginning with FIG. 3, a vertical FET is formed on an exemplary compound semiconductor substrate 310 (e.g., a GaAs substrate). Preferably, the substrate 310 is a heavily doped and highly conductive n+ layer (e.g., a conductive substrate) with a doping level in the range of about $7 \times 10^{17}$ to $5 \times 10^{18}$ cm$^{-3}$. The substrate 310 may be chosen to be sufficiently thick to provide mechanical and chemical support for semiconductor processing and handling, and may be supported by a further underlying medium. The substrate 310 serves as a source for the vertical FET, accommodating a low-resistance surface over a substantial portion of the lower surface thereof. In an alternative embodiment, the substrate 310 may serve as a drain for the vertical FET. As is well understood in the art, the source and drain for a vertical FET may be interchanged (i.e., the source may be designated as a drain, and the drain may be correspondingly designated as a source). Thus, the source and drain contacts may be referred to as "source/drain contacts."

A preferred n-type doping material for GaAs is silicon ("Si"), but selenium ("Se"), tellurium ("Te") or other doping materials or combinations thereof may be employed within the broad scope of the present invention. Although the vertical FET described herein is GaAs based, alternative compound semiconductor materials and semiconductor materials may be employed to form the substrate 310 such as a semiconductor material based on indium-phosphide ("InP") as well as oppositely doped semiconductors with essential properties of related materials appropriately altered.

A metallized layer is formed for a source contact (a source/drain contact) 320 on the lower surface of the substrate 310. The formation of the source contact 320 may be conveniently performed at a later stage of the semiconductor device processing but is illustrated now to identify the sequence of layers forming the vertical FET. Typically, about 3000-4000 Å of gold ("Au"), germanium ("Ge"), nickel ("Ni"), and then gold are preferably sequentially deposited and annealed to produce an alloy with a low-resistance ohmic contact to the substrate 310 with good adhesion and controlled species migration into the substrate 310. Other alloys such as palladium-germanium-gold, nickel-indium-germanium, palladium-germanium and aluminum-tin-nickel may be employed to advantage.

Annealing causes an alloy to form among the metallic species and allows migration of metal into adjacent semiconductor material forming a metal semiconductor eutectic, thereby enhancing its low-resistance, ohmic property. In the annealing step, germanium migrates at the elevated annealing temperature into the semiconductor material, forming an $n^+$ doped region adjacent to the metallic layer. The heavily doped, $n^+$ doped region enables an ohmic contact between the source contact 320 and the substrate 310. An electroplating process may thereafter be performed to form a thicker low-resistance source contact 320. The semiconductor device is dipped into a plating solution and is connected to an electrical current source. A seed layer deposited, for example, by vacuum deposition may be applied before a wet plating process. A metal material of the plating solution (e.g., either platinum or gold) becomes ionized and is deposited on a conductive surface.

Figure 4:
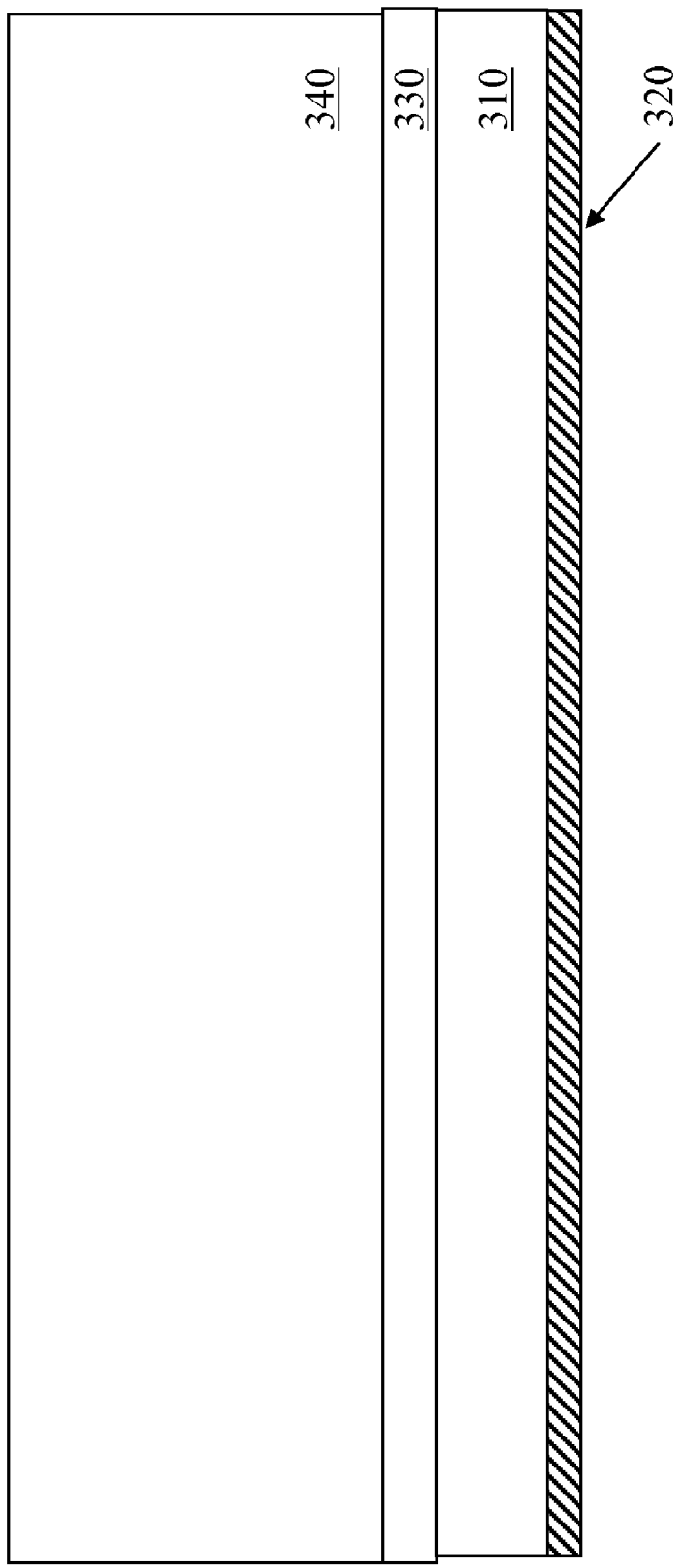

Turning now to FIG. 4, above the substrate 310 is a buffer layer (e.g., an n+ epitaxial buffer layer) 330 that is preferably grown via molecular beam epitaxy or metal-organic chemical-vapor deposition to a thickness of about 3000 angstroms ("Å"). A suitable n-type doping material such as Si may be employed, but alternatively Se, Te or other n-type dopant or combinations thereof may be employed in the epitaxial growth process. A preferred doping density is in the range of about $7 \times 10^{17}$ to $1 \times 10^{19}$ cm$^{-3}$. The addition of the buffer layer 330 generally provides a more uniform crystal structure for further epitaxial depositions than an ordinary, doped substrate 310, and thus may be optionally included for the formation of the above layers for improved device characteristics.

Above the buffer layer 330 is a channel layer (e.g., a lightly doped, epitaxially grown, n-type layer) 340 that will be later etched and profiled to form a vertical channel. A preferred thickness for the channel layer 340 is about 15,000 Å. A preferred dopant is silicon and a preferred doping density is about $1 \times 10^{16}$ cm$^{-3}$ to $5 \times 10^{16}$ cm$^{-3}$. Of course, other n-dopants and doping densities for the channel layer 340 may be used, as is well understood in the art. The doping density for the channel layer 340 is selected to be sufficiently conductive when the vertical FET is turned on, but not so high that a gate structure to be deposited later can exhibit sufficient conductivity control to disable a conductivity of the vertical FET. As discussed later herein, the doping density and sizing of the channel layer 340 should be selected to be sufficiently light in view of the required on-resistance of the semiconductor device so that the resistance thereof (when the gate voltage with respect to the source contact is substantially zero) is sufficiently high that critical circuit nodes in, for instance, a power supply or other application are not shorted with a low drain-to-source resistance when the power supply is initially turned on with substantially zero gate voltage.

Figure 5:
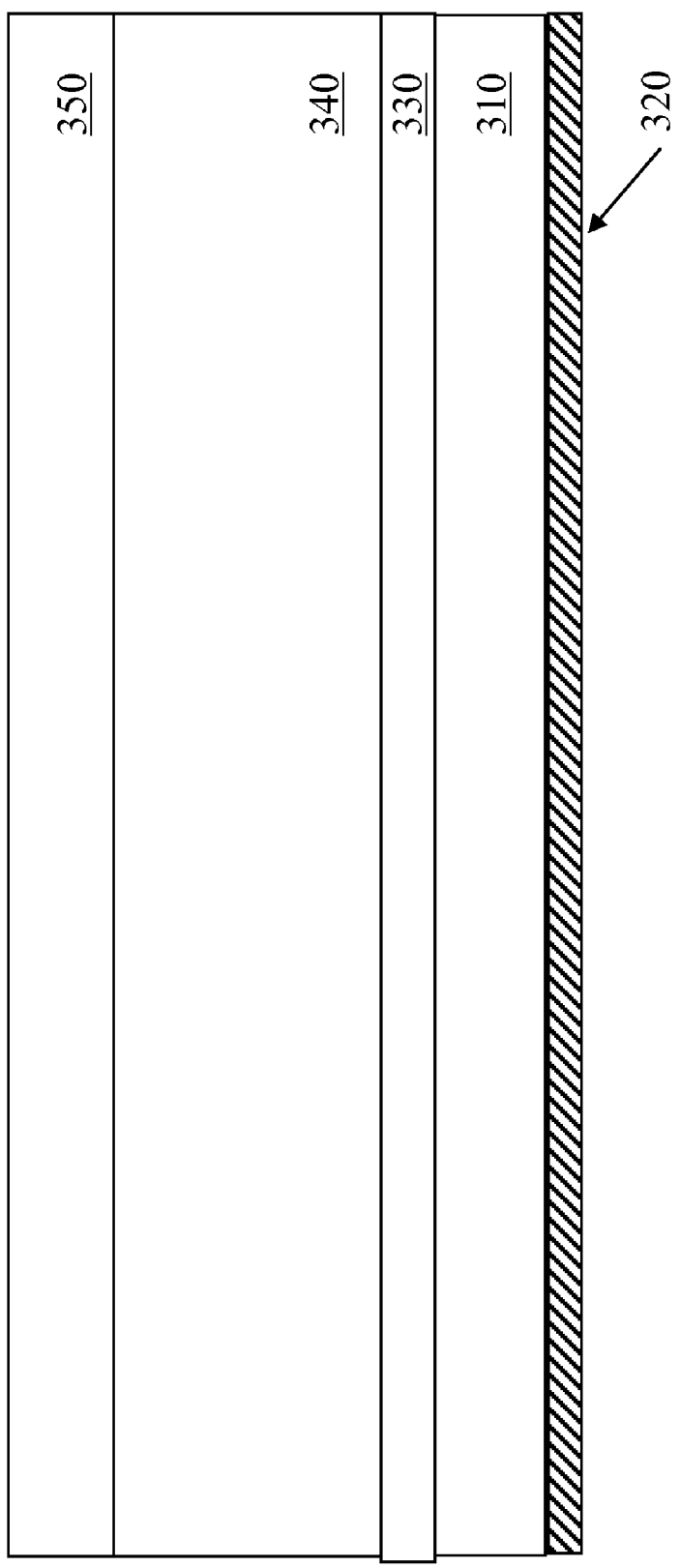

Turning now to FIG. 5, above the channel layer 340 is a source/drain layer (e.g., a drain layer being a heavily doped, n+ layer) 350, epitaxially grown and doped to a preferred doping density in the range of about $7 \times 10^{17}$ to $1 \times 10^{19}$ cm$^{-3}$. The doping density of the drain layer 350 is high to produce an ohmic contact with a layer of metallization to be deposited thereabove in a later step. A preferred thickness for the drain layer 350 is about 200 Å. Of course, the channel layer 340 and drain layer 350 may be epitaxially grown in a single step, with the heavy doping of the drain layer 350 being performed with an ion implant or with a change in the deposition concentration of the dopant to produce the drain layer 350. A preferred n-type doping material for the channel layer 340 and drain layer 350 is silicon ("Si"), but selenium ("Se"), tellurium ("Te") or other doping materials or combinations thereof may be employed.

Figure 6:
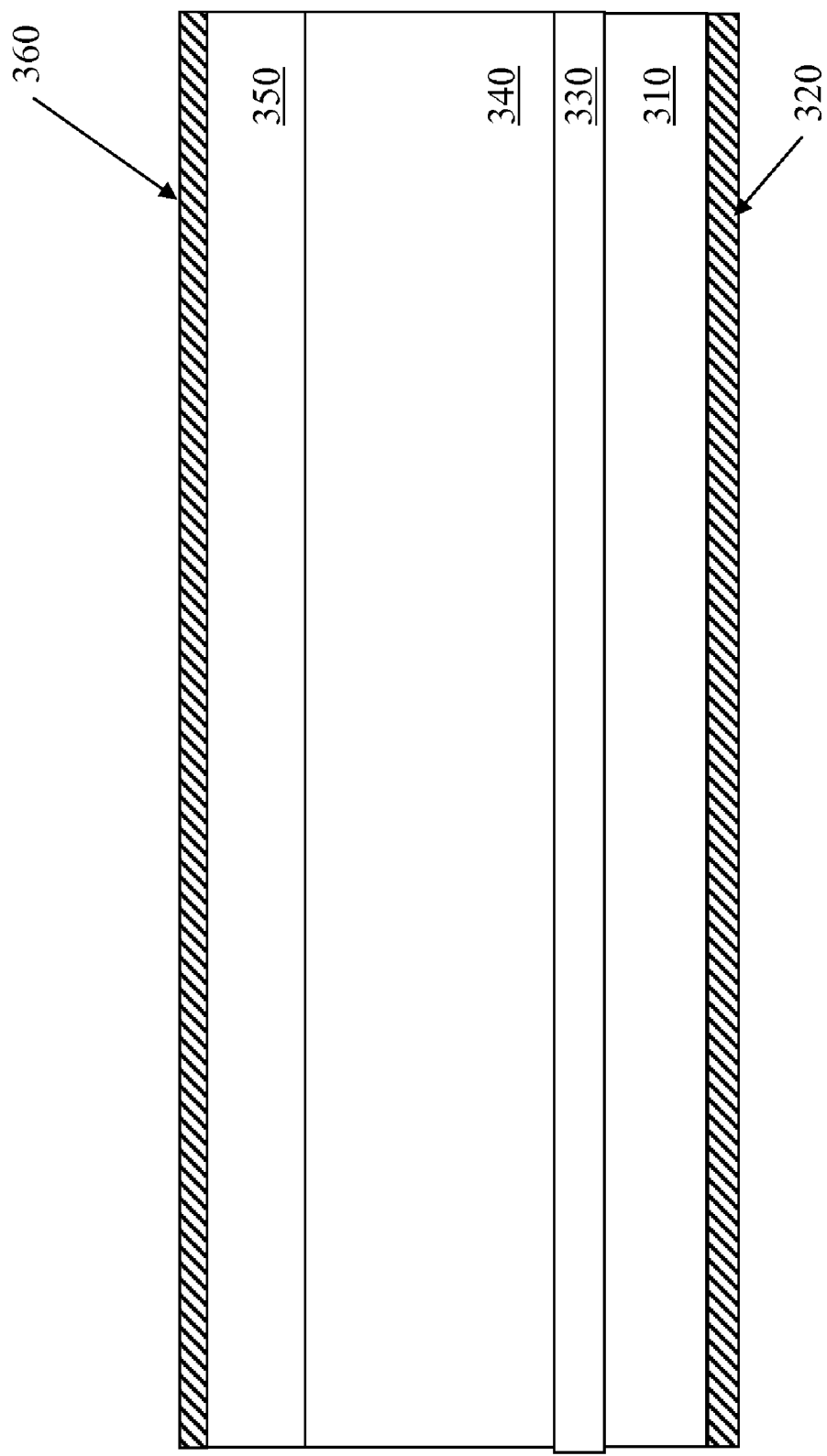

Turning now to FIG. 6, above the drain layer 350, a metal layer is deposited that will form a drain contact (a "source/drain contact") 360 for the vertical FET. Again, about 3000-4000 Å of gold ("Au"), germanium ("Ge"), nickel ("Ni"), and then gold are preferably sequentially deposited and annealed to produce an alloy with a low-resistance ohmic contact with good adhesion. Other metal alloys may also be used for the drain contact 360 as described hereinabove.

Figure 7:
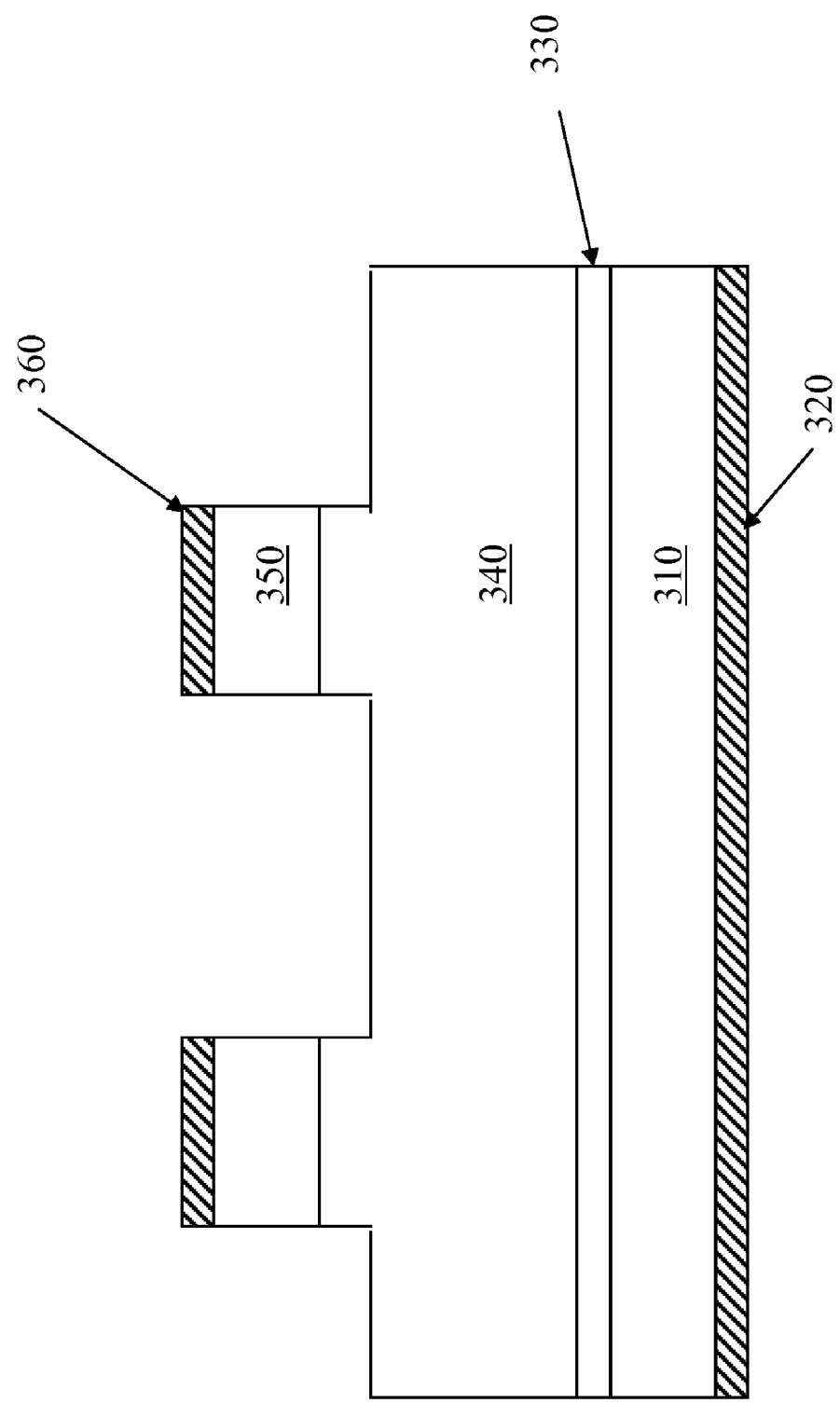

The semiconductor device is then patterned with a photoresist and etched in several processing steps to produce the profiled semiconductor device as illustrated in FIG. 7. First the metal layer (that forms the drain contact 360) is etched with a wet etch such as a sulphuric acid-based etchant, followed by a dry etch to form the indicated profile of the channel layer 340 and the drain layer 350. The etching processes form "pillars" or "pillar regions" that will produce vertical cells that will collectively form a vertical FET when coupled in parallel.

Figure 8:
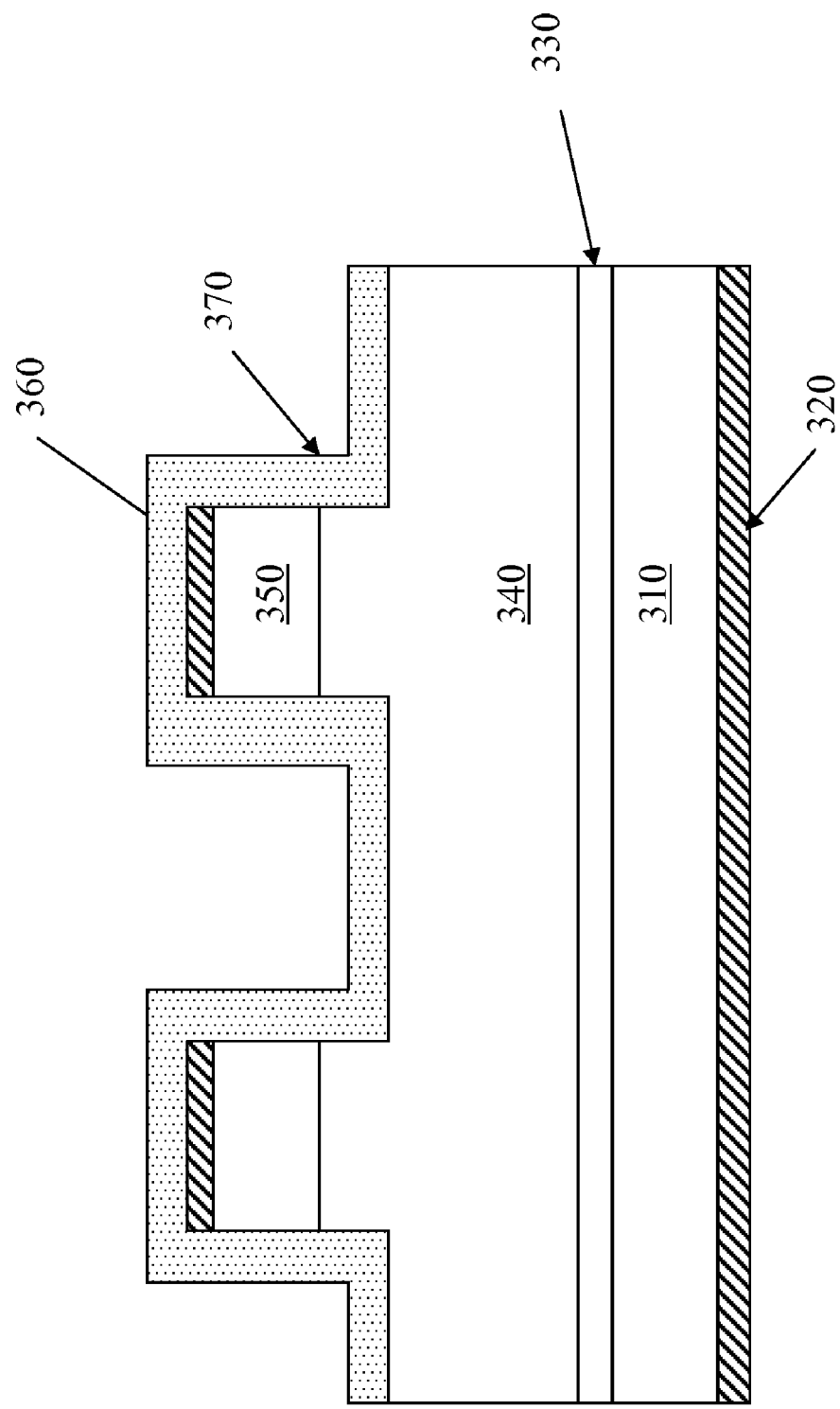

Turning now to FIG. 8, a conformal dielectric layer 370 is preferably deposited across substantially the entire surface of the semiconductor device or wafer, preferably about 30-50 nm thick. Preferably, the dielectric material is a material with a low dielectric constant (e.g., BCB, polyimide, Si glass, or other flowable oxide or nitride). The dielectric layer 370 is typically deposited by plasma enhanced chemical vapor deposition ("PECVD") process for further surface passivation as necessary. The thickness of the dielectric layer 370 can be accurately controlled, such as by controlling deposition power and time. The dielectric layer 370 is strong enough to provide mechanical and chemical support for subsequent processing steps.

Figure 9:
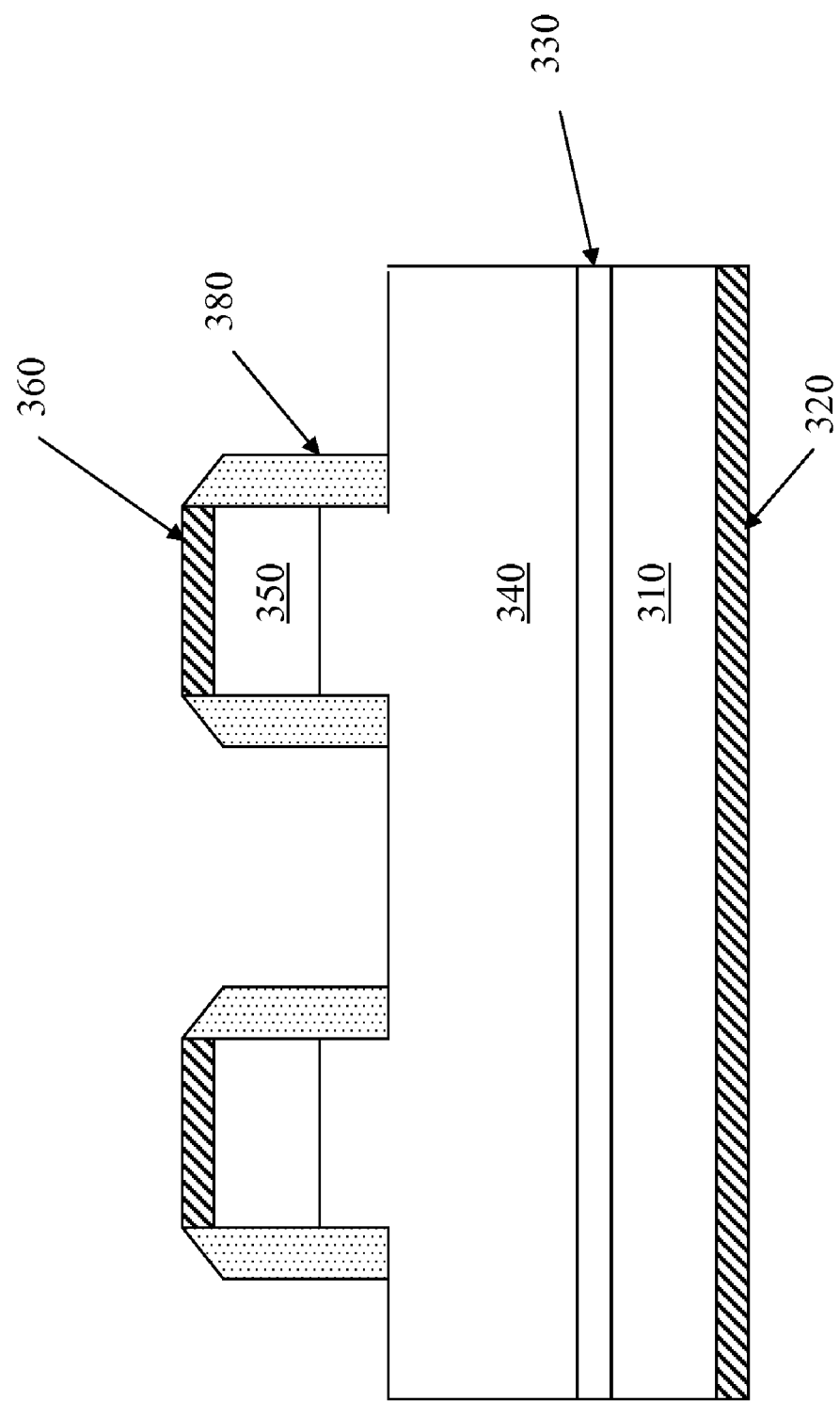

Following deposition of the dielectric layer 370, an anisotropic etch such as a reactive-ion etch is performed on the wafer to remove the dielectric layer 370 that was just deposited from horizontal surfaces to produce sidewall spacers 380 for the vertical FET. The resulting profile of the semiconductor device after removal of the horizontal dielectric layer 370 is illustrated in FIG. 9. The inclusion of a dielectric to produce sidewall spacers 380 is an optional element in the design of the vertical FET, and may be omitted in certain applications.

Figure 10:
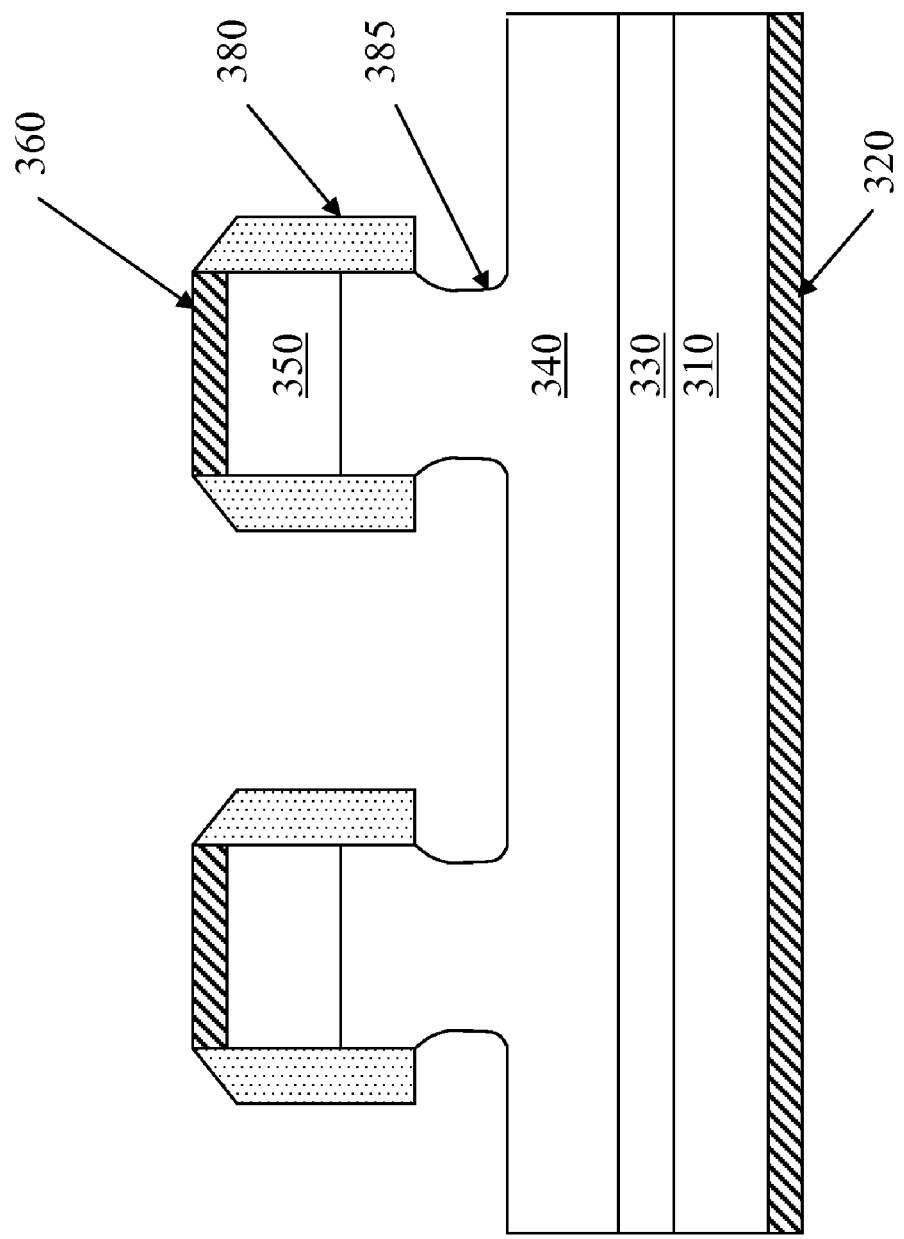

Turning now to FIG. 10, illustrated is a cross-sectional view of the semiconductor device after a wet etch such as a phosphoric acid, sulphuric acid, or sulphuric acid and peroxide etch, or a dry etch such as a higher pressure reactive-ion etch with lateral etching capability that selectively etches the exposed semiconductor surfaces, not substantially the dielectric sidewall spacers 380. The etching process removes a portion of the upper surface of the channel layer 340 and the drain layer 350, producing undercut regions 385 under the sidewall spacers 380. The remaining portions of the channel layer 340, particularly between undercut regions 385, will become the vertical channels with controllable conduction after the formation of gates.

Figure 11:
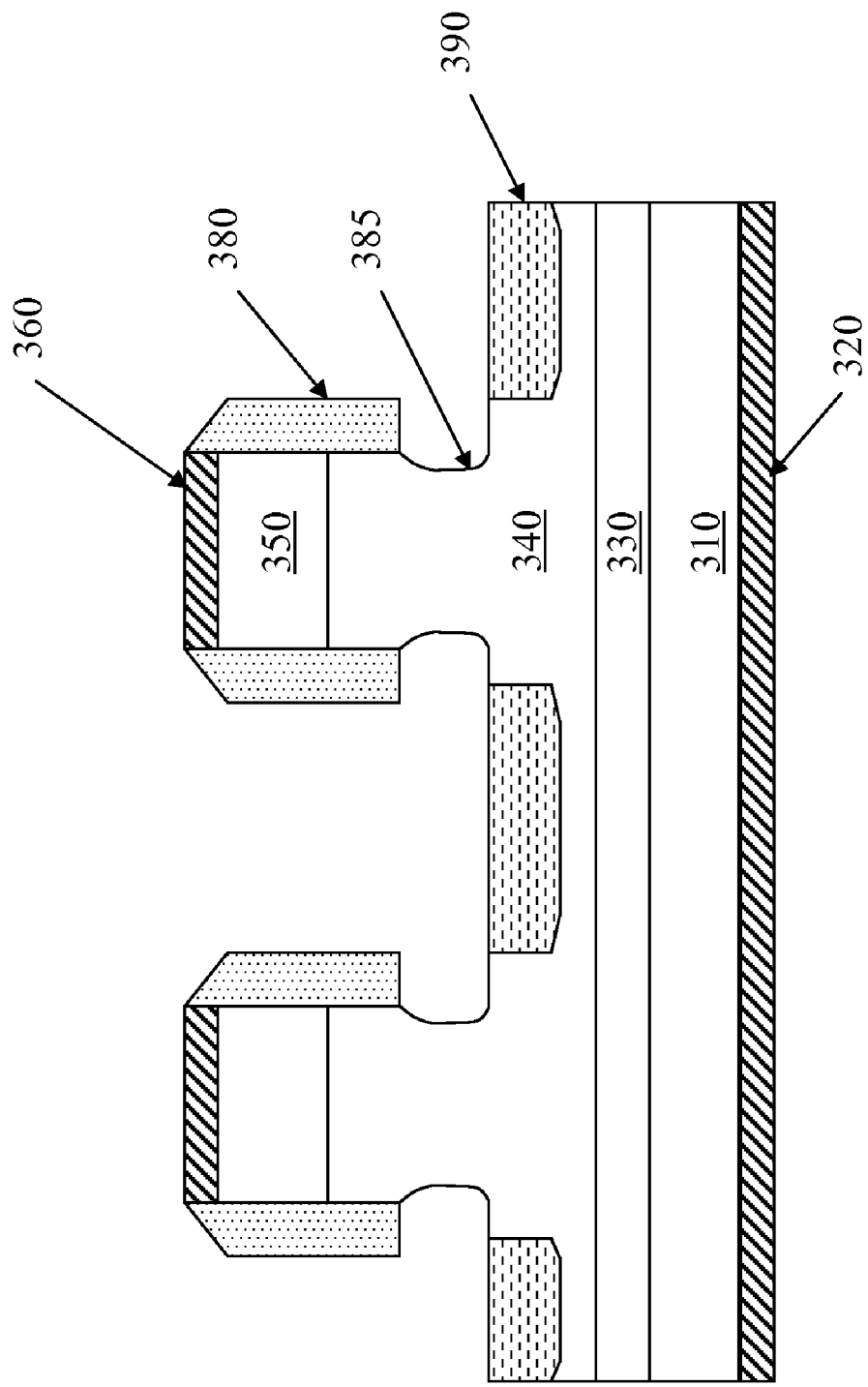

Turning now to FIG. 11, illustrated is a cross-sectional view of the semiconductor device after the formation of non-conductive regions 390 in the channel layer 340. The non-conductive regions 390 provide isolation barriers between the gates to be deposited next and the vertical channel and the buffer layer 330. The non-conductive regions 390 are formed by ion implant with oxygen, a proton source, helium, argon, or iron, which preferably can be performed as a self-aligned process. The implantation process damages the crystal structure of the exposed semiconductor surfaces resulting in amorphous regions that are sufficiently non-conductive. Further options to form non-conductive regions 390 include etching and refilling with a non-conductive material.

Figure 12:
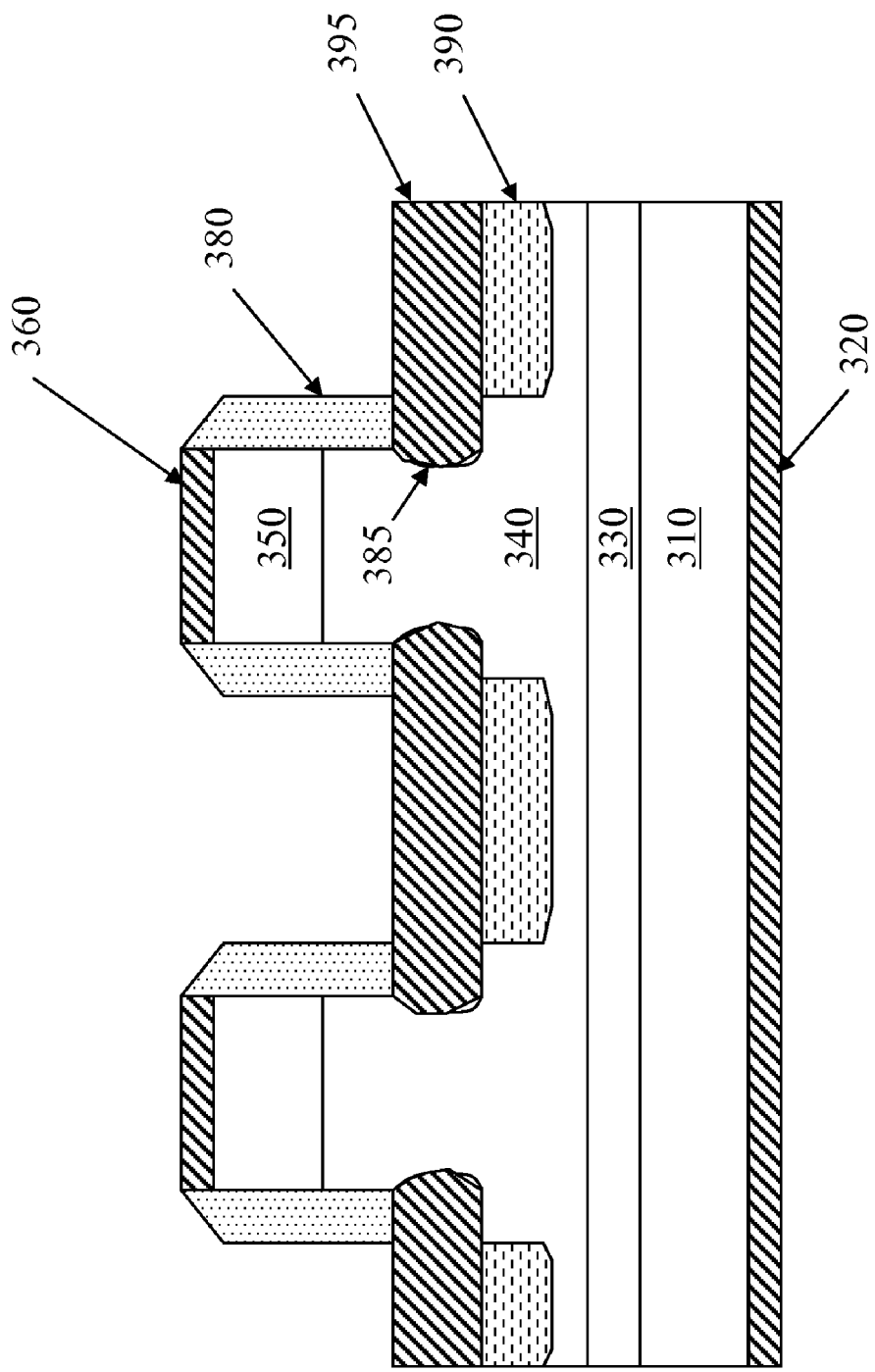

Turning now to FIG. 12, illustrated is a cross-sectional view of the semiconductor device after deposition of a metal layer that forms the gates 395, preferably partially recessed in the undercut regions 385. The deposition of the gates 395 may be performed with a plating process that may be initiated using vacuum deposition or sputtering of a conductive seed layer, wherein an electrical contact may be made to the source contact 320 during the plating process. Gate metal can be prevented from plating on the drain contacts 360 by patterning and deposition of a dielectric material or other resistant layer thereon in an earlier step, such as after deposition of the metal that forms the drain contacts 360. The gates 395 are preferably platinum ("Pt") to provide good adhesion with the adjacent layers and resistance over time to atomic diffusion. The gates 395 can also be formed with multiple layers, preferably metallic multi-layer titanium-platinum-gold ("TiPtAu"), but other multi-layer sequences such as titanium-tungsten ("TiW"), tantalum-nitrogen ("TaN"), rhodium ("Rh"), and tungsten-silicon ("WSi") can also be used within the scope of the present invention.

A parallel-coupled Schottky diode with a common contact with a source/drain contact of the vertical FET and another contact that can be readily coupled to a source/drain contact of the vertical FET can be formed on the same die with only a few additional processing steps as set forth below. To form a device including a vertical FET and a Schottky diode that shares a source/drain contact of the vertical FET, it is necessary to first deposit, pattern, expose, and selectively remove a portion of a photoresistive layer to protect portions of the channel layer 340 prior to formation of the non-conductive regions 390, described hereinabove with reference to FIG. 11. In this manner, Schottky contacts can be directly deposited onto substantially unaltered and conductive regions of the channel layer 340.

Figure 13:
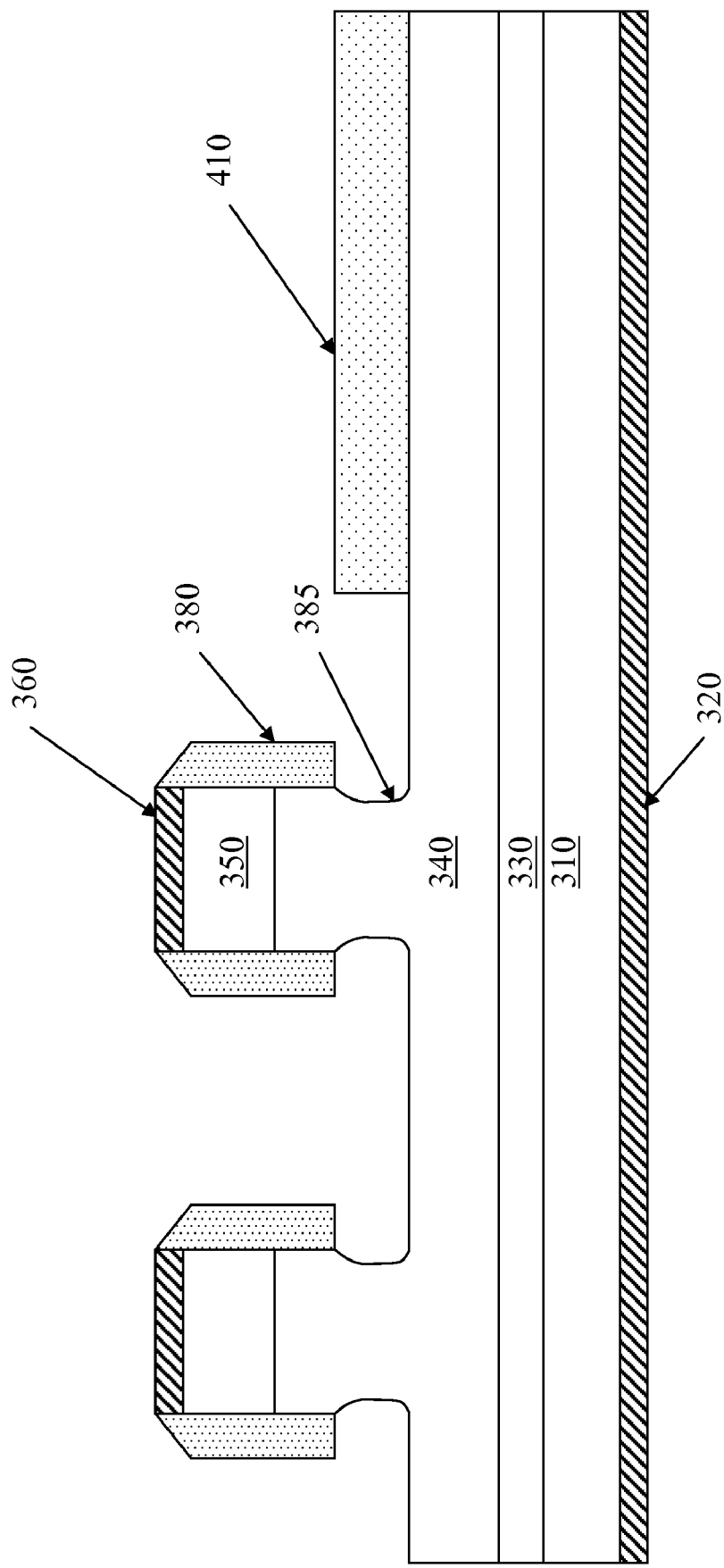
Figure 14:
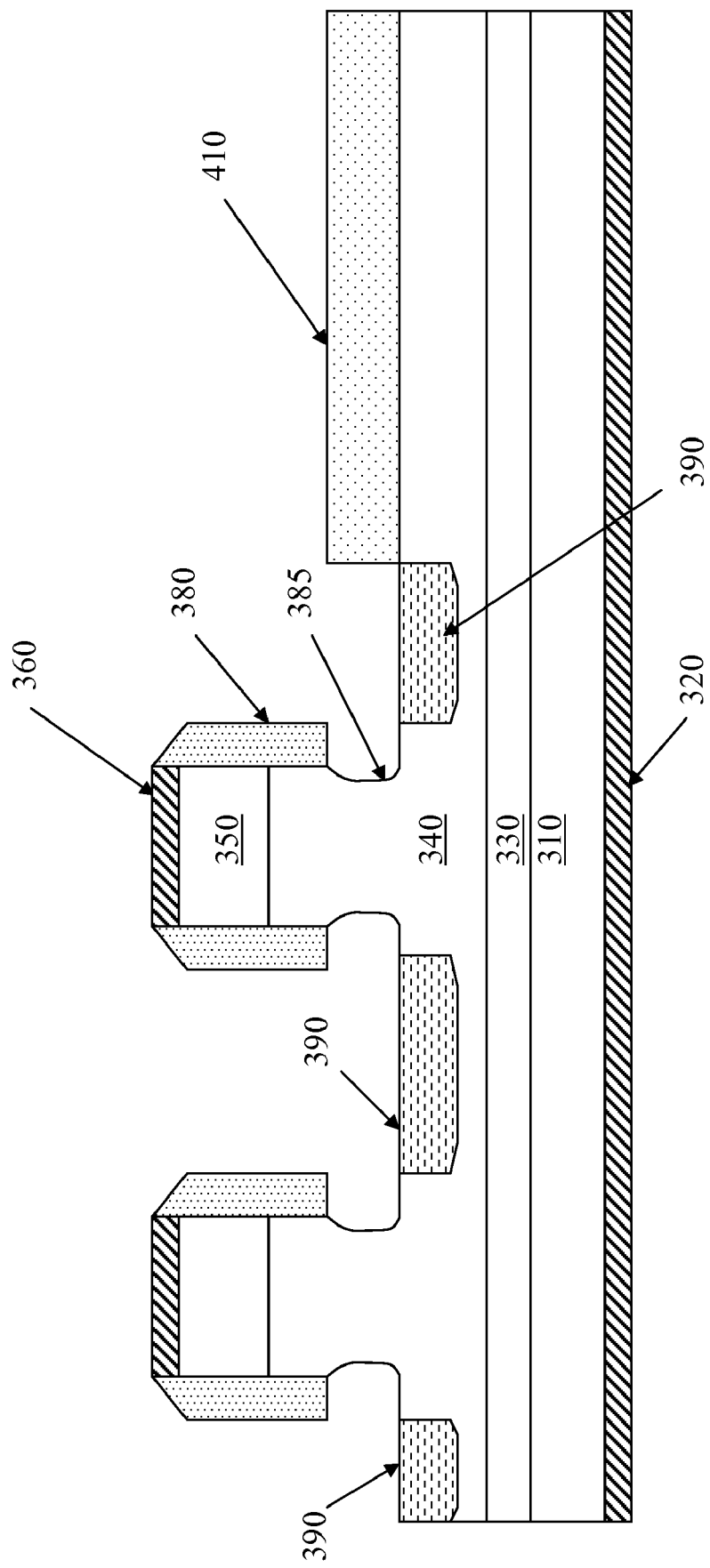
Figure 15:
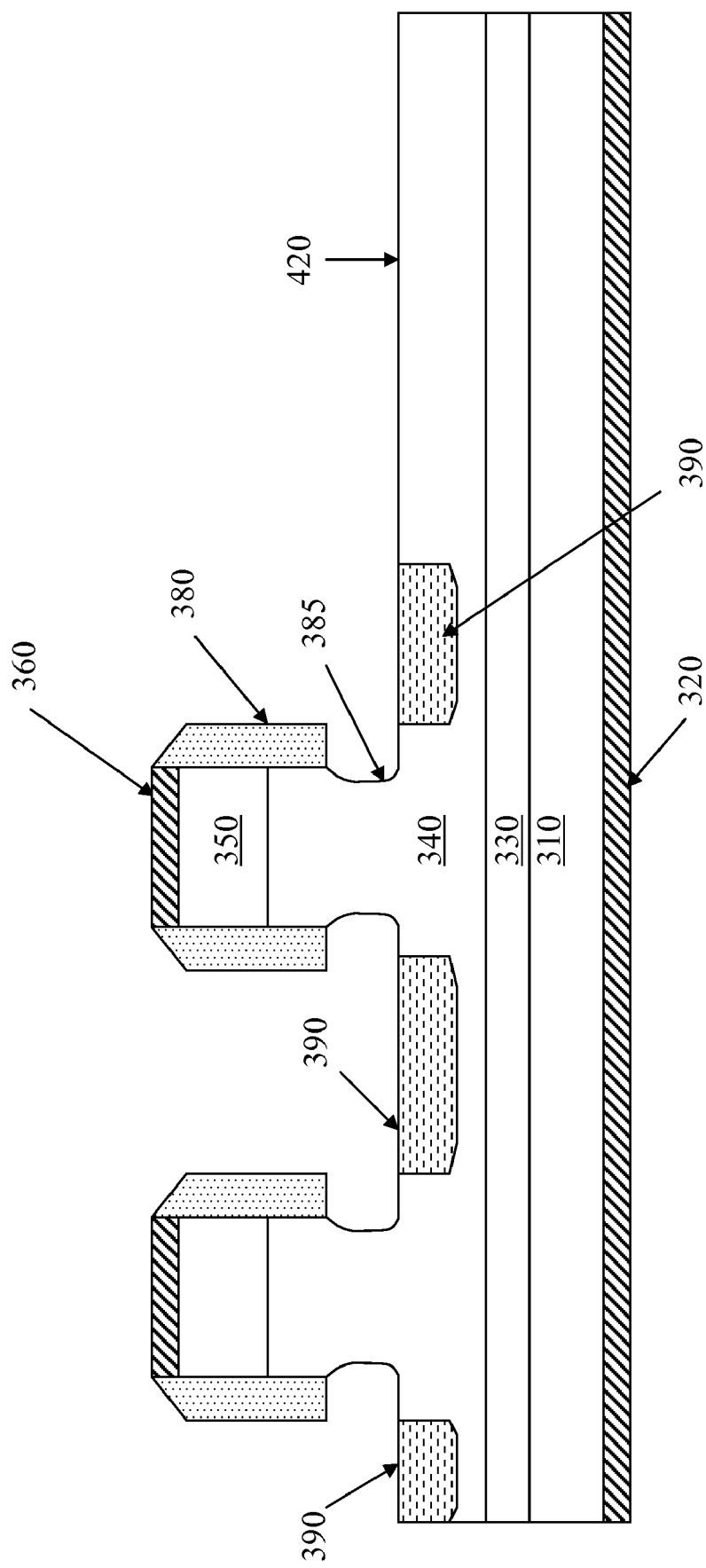

Turning now to FIGS. 13-15, FIG. 13 illustrates a photoresist layer 410 that has been so deposited, patterned, exposed, and selectively removed prior to formation of the non-conductive regions 390 previously described, to protect the region thereunder from becoming non-conductive. The non-conductive regions 390 are then formed as described previously hereinabove with reference to FIG. 11, and illustrated now in FIG. 14. Remaining portions of the photoresistive layer 410 are then completely removed, leaving non-conductive regions 390 in the channel layer 340, as well as an exposed surface 420 of the channel layer, as illustrated in FIG. 15, that is substantially unaltered by the process that forms the non-conductive regions 390.

Figure 16:
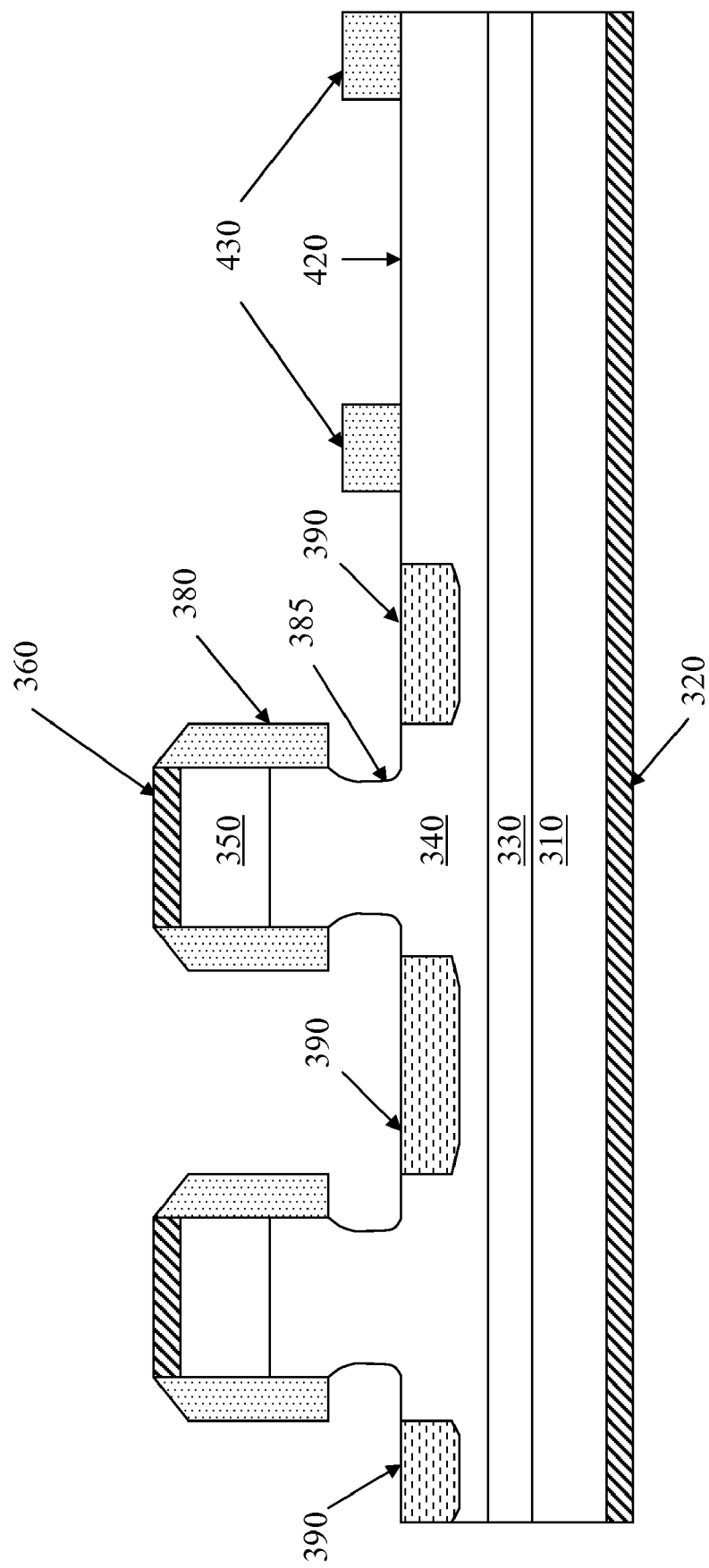

Turning now to FIG. 16, it is necessary to deposit, pattern, expose, and selectively remove portions of a further photoresistive layer 430 to delineate regions to separate the gate to be formed over non-conductive regions 390 of the channel layer 340 from Schottky contacts to be formed over the exposed surface 420 of the channel layer 340 not so altered. Processes to form and process these various photoresistive layers are well-known in the art and will not be further described. The gate and Schottky contacts are then deposited onto the channel layer 340 as previously described with reference to FIG. 12, and the patterned photoresistive layer 430 is then removed, leaving a separation between the gates and the Schottky contact.

Figure 17:
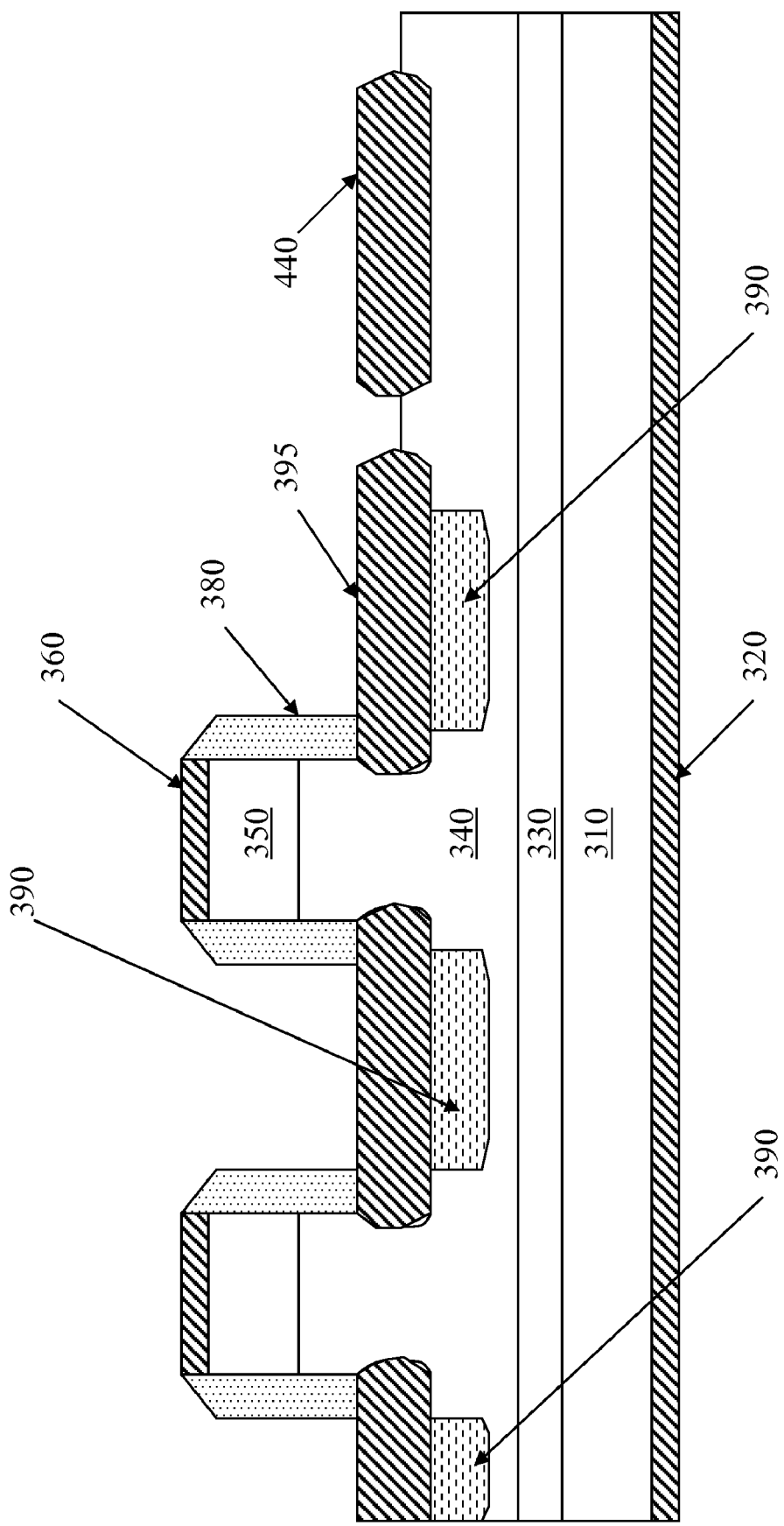

Turning now to FIG. 17, illustrated is a cross-sectional view of the semiconductor device with the Schottky contact 440 formed above the channel layer 340 and separated from the gate 395. The Schottky contact 440 is preferably deposited at the same time and of the same material as the gates 395. In a preferred embodiment, the gates 395 and the Schottky contacts 440 are formed of metallic multi-layer titanium-platinum-gold. The channel layer 340 is preferably lightly doped with silicon in the range $1\times10^{16}$ to $5\times10^{16}$ cm$^{-3}$ to avoid formation of an ohmic contact between the metal of the Schottky contact 440 and the underlying channel layer 340. In the illustrated embodiment, the channel layer 340 forms the cathode and the Schottky contact 440 forms the anode of the Schottky diode. The addition of a Schottky diode advantageously provides the functionality and convenience of the body diode ordinarily formed in a silicon-based FET with minimal additional processing effort.

An alternative formation of a parallel-coupled Schottky diode with the Schottky contact on the back (lower) side of the semiconductor device in direct contact with the metallic source contact will now be described. The description below of the formation in an advantageous embodiment of a Schottky contact on the back side of the semiconductor device assumes that top-side processing has been substantially completed, including formation of the drain and gate contacts on the top side of the semiconductor device. It is further assumed that the source contact has not yet been formed on the bottom or backside of the semiconductor device. However, variations in the processing sequence as described hereinbelow will be apparent to one skilled in the art, and are well within the broad scope of the present invention.

Figure 18:
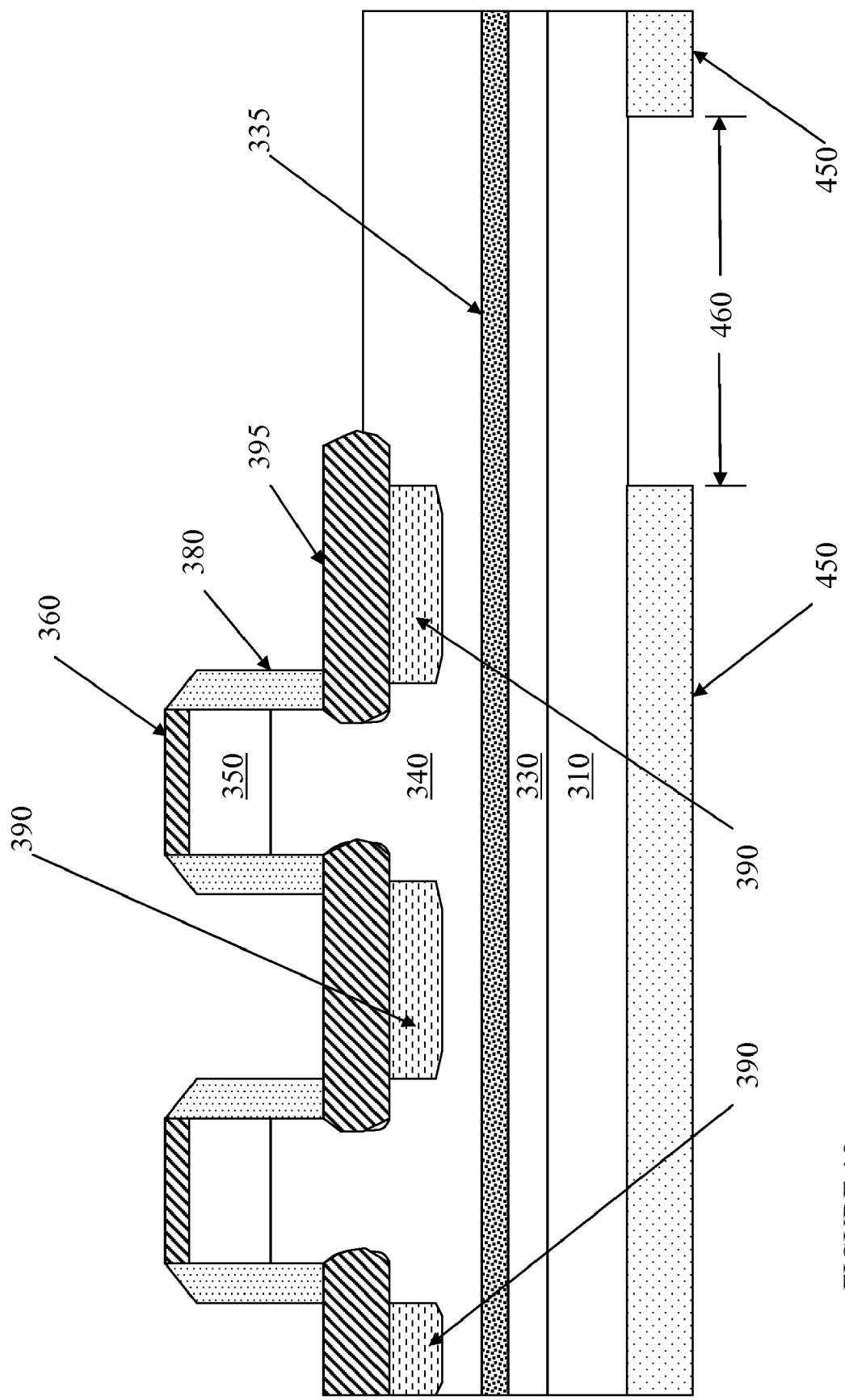

Turning now to FIG. 18, illustrated is a cross-sectional view of the semiconductor device before formation of the source contact 320 on the bottom of the device. The bottom of the semiconductor device is patterned and etched with another photoresist 450 on the lower surface of the substrate 310 to form the an aperture 460 in the photoresist, which exposes a portion of the substrate 310 to further processing.

The etching process to be performed next on the substrate 310 and on the buffer layer 330 can be optionally controlled by inclusion of an etch-stop layer 335 between the buffer layer 330 (described previously with reference to FIG. 4) and the channel layer 340. Following formation of the buffer layer 330, the etch-stop layer 335 is optionally deposited before deposition of the channel layer 340. A preferred etch-stop layer material is AlGaAs ("aluminum-gallium arsenide").

Figure 19:
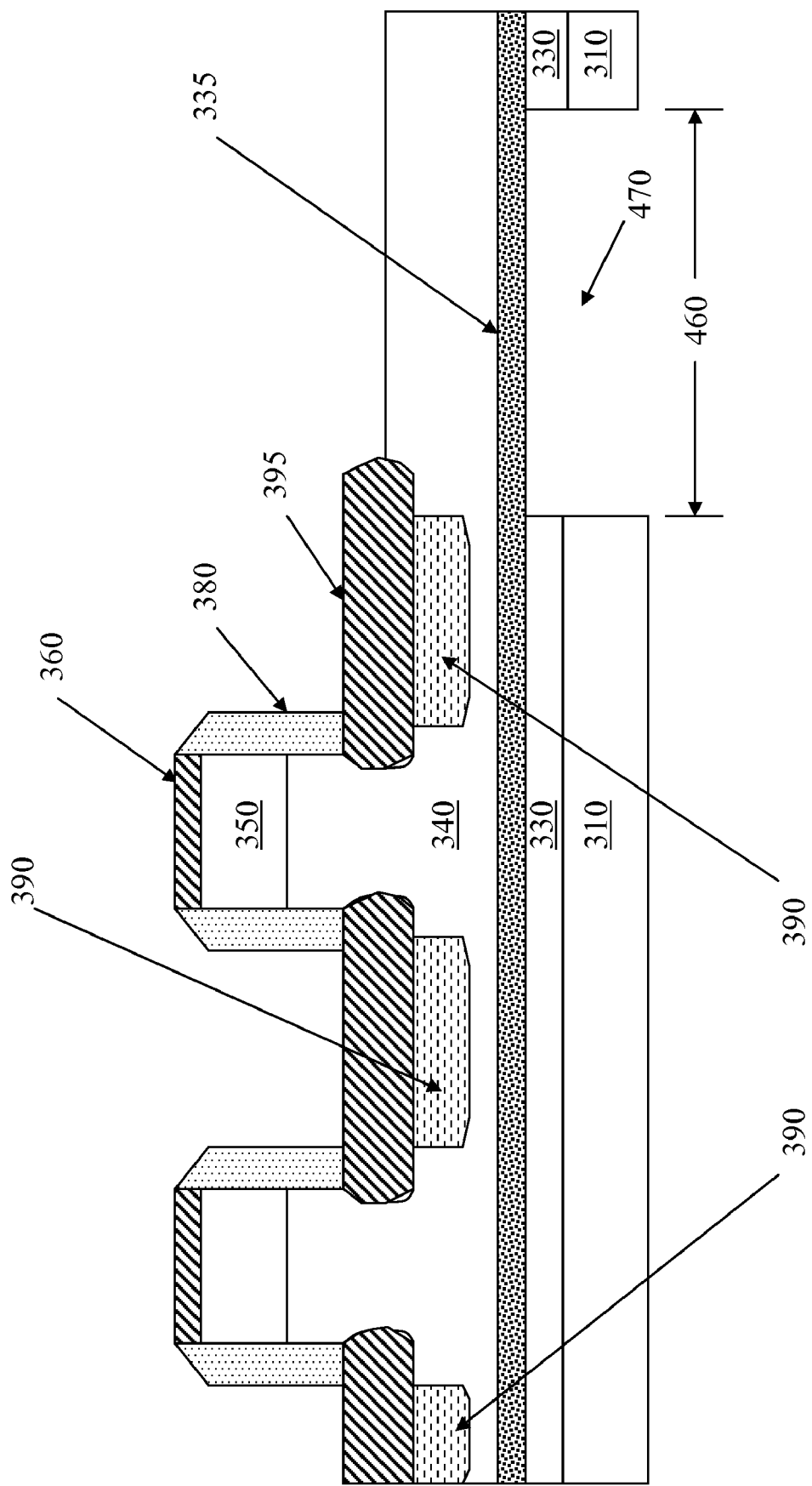
Figure 20:
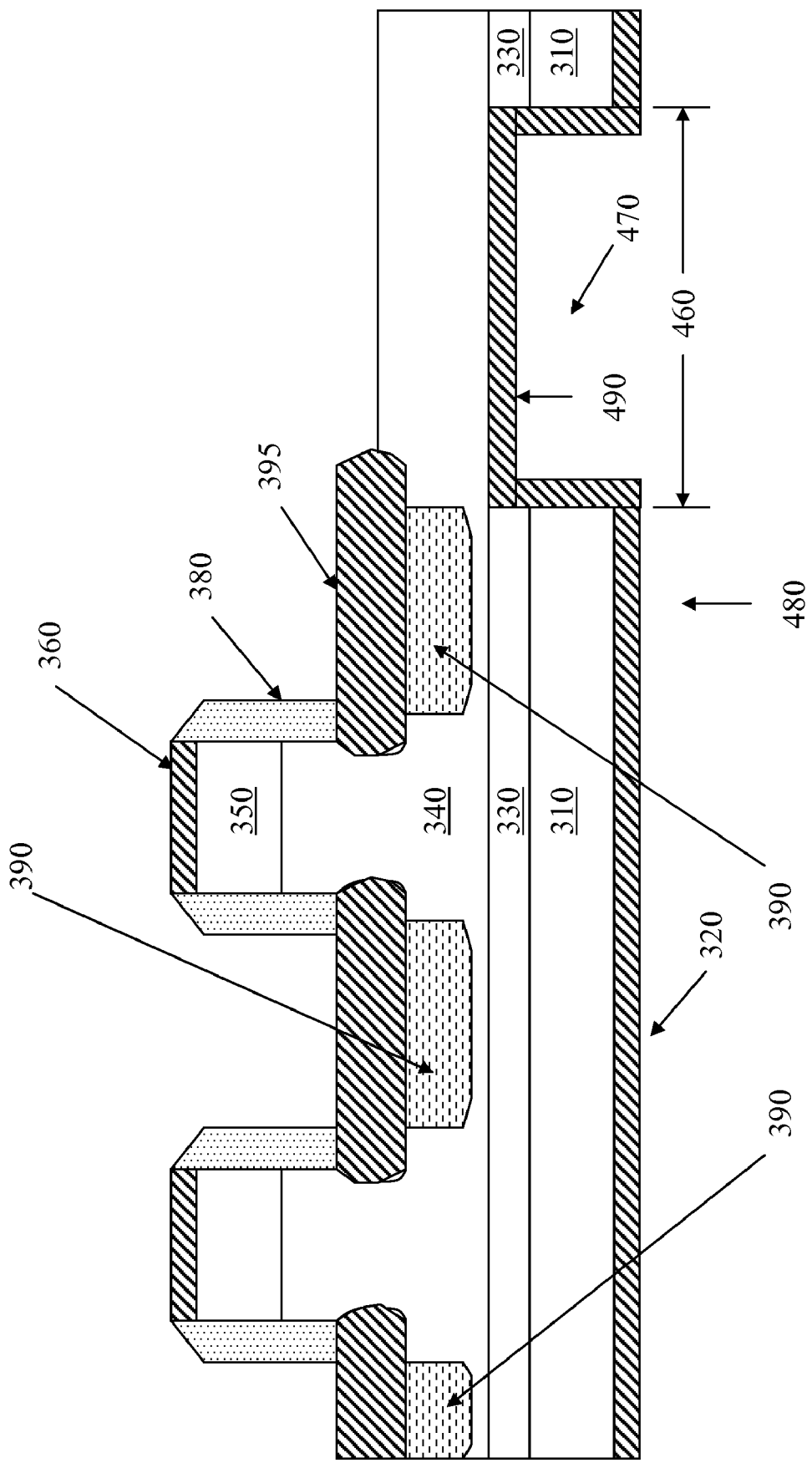

Turning now to FIGS. 19 and 20, after patterning the bottom side of the semiconductor device with the photoresist 450 and etching to form the photoresist aperture 460, the bottom surface of the semiconductor device is etched to the etch-stop layer to form a trench 470, preferably using a dry etch such as an reactive ion etch ("RIE") etch. The etch-stop layer 335 is then removed from the trench 470, preferably using a selective wet-etch process. An appropriate etchant or etchants such as an acid wet etch can be used for the selective removal of the etch-stop layer 335, as is well understood in the art. The etch-stop layer 335 outside of the trench 470 remains between the buffer and channel layers 330, 340, which does not have significant adverse effects on the end performance of the semiconductor device, recognizing the insignificant thickness and wide area of the etch-stop layer 335 in the direction of carrier flow.

In an optional processing sequence, the etch-stop layer 335 may be omitted and the etching process through the substrate 310 (and through the buffer layer 330) progresses into the channel layer 340, forming the trench 470 in the substrate 310 (and in the buffer layer 330). The portions of these layers in the trench 470 are preferably removed with a dry etch, such as an RIE etch. Alternative etching processes can also be used to remove the indicated material, as is well known in the art.

As illustrated in FIG. 20, following the etching process, the bottom surface of the semiconductor device including surfaces in the trench 470 are plated with a metal contact 480 to form a Schottky contact 490 on the channel layer 340 in the trench 470 and the source contact 320. Suitable plating materials for the metal contact 480 include metallic multi-layer titanium-platinum-gold ("TiPtAu"), but other multi-layer sequences such as titanium-tungsten ("TiW"), tantalum-nitrogen ("TaN"), rhodium ("Rh"), and tungsten-silicon ("WSi") can also be used within the scope of the present invention. Accordingly, the Schottky contact 490 within the trench 470 provides an anode that cooperates with the channel layer 340 to provide a cathode for the Schottky diode.

The trench 470 is illustrated in FIGS. 19 and 20 with substantially vertical walls. However, in a practical device, the walls of the trench 470 may be sloped and/or curved, depending on parameters and execution of the etching process. Although a trench 470 is illustrated, other geometrical depressions such as a circularly, elliptically, or hexagonally shaped depression may be formed within the scope of the present invention and will be included herein by use of the term "trench." Also included by the term "trench" are step changes in the surface level of the die without a corresponding step change back to the original surface level. Thus, a Schottky diode with a contact on the lower side of the device parallel-coupled to the vertical FET is produced with minimal additional processing steps.

An enhancement-mode vertical FET can be produced by several adjustments to the processing steps described previously hereinabove. For purposes of illustration, any modifications to the processing steps to attain an enhancement-mode device will be described with reference to the semiconductor device illustrated and described with respect to FIGS. 3 to 20 above. One alternative is to limit the doping level of the channel layer to a level that allows the vertical channel to be depleted at substantially zero gate (to source) voltage, which reduces the level of the free carriers in the vertical channels so that the channel resistance will be several orders of magnitude higher than a depletion-mode design with substantially zero gate voltage. For example, an enhancement-mode vertical FET can be formed with a channel thickness of about 1.0 μm, and a light channel n-doping level of about $5 \times 10^{15}$ cm$^{-3}$. It may not be necessary in practical circuit designs for the vertical FET to provide essentially an open circuit when the gate voltage is substantially zero. A careful engineering assessment of the proper doping level for the channel layer should be made to determine the best trade-off of channel resistance for substantially zero gate voltage and the resulting on-resistance of the device for a positive gate voltage. The reduction of free carriers in the channels outside the region of the gate resulting from a reduced doping level may raise the on-resistance of the vertical FET. This effect can be reduced by selectively grading the channels with an n-type dopant in regions away from the gate. Another approach to produce an enhancement mode device is to make the channel sufficiently thin so that the channel is fully depleted by the Schottky barrier formed by the gate metal. For example, an enhancement-mode vertical FET can be formed with a thin channel thickness of about 0.7 μm, and a channel n-doping level of about $1 \times 10^{16}$ cm$^{-3}$. Thus, a doping density or a thickness of the channel layer is limited to form an enhancement mode device.

Figure 21:
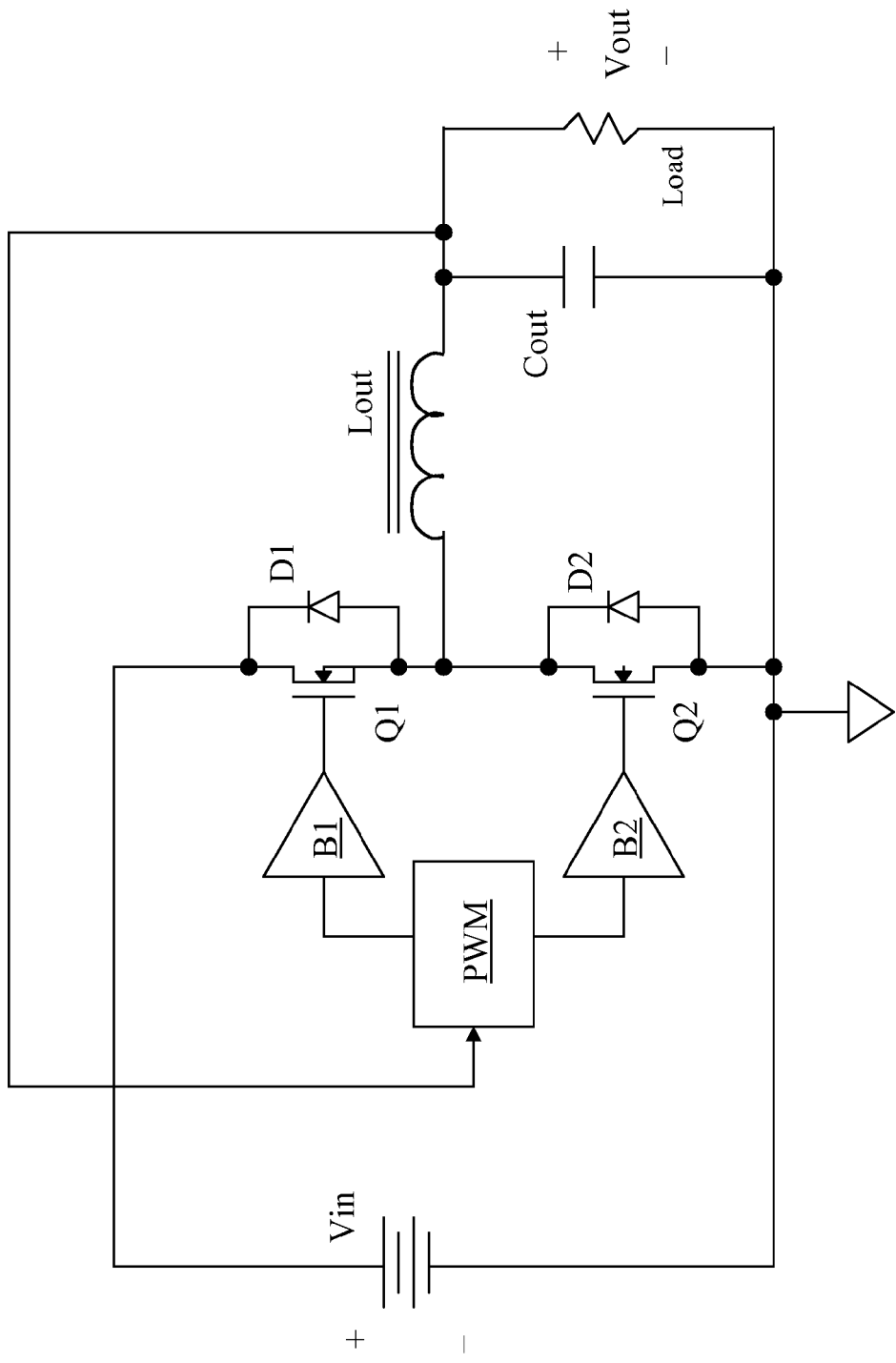
FIGS. 21 and 22 illustrate schematic diagrams of exemplary power converters including a semiconductor device with a vertical field-effect transistor constructed according to the principles of the present invention.

Referring next to FIG. 21, illustrated is a schematic diagram of an exemplary power converter including a semiconductor device with a vertical field-effect transistor constructed according to the principles of the present invention. The power converter is powered from a source of electrical power (e.g., an input power source Vin illustrated by a battery). In the illustrated embodiment, the power converter employs a buck power converter topology with main and auxiliary power switches Q1, Q2 formed as compound semiconductor switches with vertical FETs constructed according to the principles and methods of the present invention. Exemplary compound semiconductors include group III-V elements.

The power switches Q1, Q2 are depletion mode switches. A depletion mode switch is a switch that conducts with zero volts (or substantially zero volts) applied to a control terminal thereof, and is substantially disabled to conduct when a negative voltage is applied to the control terminal. Of course, a switch of the opposite sense that conducts with zero volts (or substantially zero volts) applied to a control terminal thereof, and is substantially disabled to conduct when a positive voltage is applied to the control terminal is also within the broad scope of the present invention. The main and auxiliary power switches Q1, Q2 may be formed, as described hereinabove, preferably and without restriction, with dielectrically isolated control terminals (e.g., gate terminals). Alternatively, the control terminals may be formed as control terminals akin to those of junction field-effect transistors, which exhibit diode characteristics with respect to a source terminal thereof. A general operation of a conventional buck power converter and its associated pulse-width modulator is well known in the art and will not herein be discussed in detail.

As part of a controller of a control circuit for the power converter illustrated in FIG. 21, a pulse-width modulator (designated "PWM") provides control signals (as a function of a characteristic such as an output voltage Vout of the power converter) for first and second drivers (typically, first and second gate drivers designated "B1" and "B2"), which provide drive signals to the control terminals (typically, the gate terminals) of the main and auxiliary power switches Q1, Q2, respectively. Thus, the controller controls the main and auxiliary power switches Q1, Q2 by providing drive signals to control terminals thereof as a function of a characteristic of the power converter to control conduction intervals thereof thereby providing a regulated output characteristic. The first driver B1 in the exemplary embodiment illustrated in FIG. 21 is a high-side driver capable of driving the control terminal of the main power switch Q1 with the source terminal thereof not referenced to ground potential. First and second diodes D1, D2 represent diodes formed within the die of each semiconductor device forming the main and auxiliary power switches Q1, Q2, respectively, as described previously hereinabove, or discrete diodes coupled in parallel with the main and auxiliary power switches Q1, Q2, respectively.

The control circuit may also include a protection circuit that induces an application of a drive signal having a non-zero value such as a negative value (e.g., a negative gate-to-source voltage) to the control terminals (again, gate terminals) to substantially disable the main and/or auxiliary power switches Q1, Q2 in response to transient conditions of the power converter. An output filter for the power converter includes an output inductor Lout and an output capacitor Cout to filter the regulated output characteristic (e.g., a substantially dc output voltage Vout). The load for the power supply is illustrated by a resistor (designated "Load").

Figure 22:
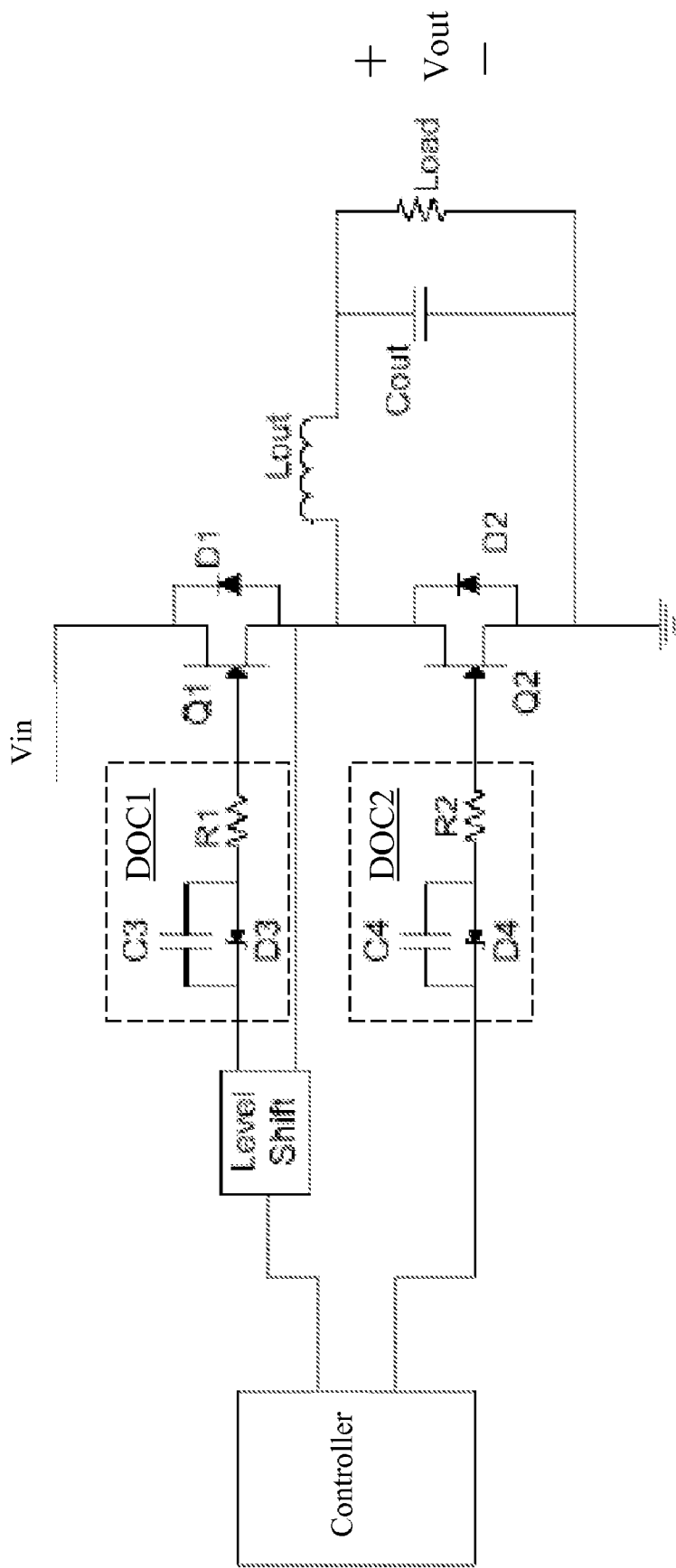

Turning now to FIG. 22, illustrated is a schematic diagram of another exemplary power converter including a semiconductor device with a vertical field-effect transistor constructed according to the principles of the present invention. The power converter employs a buck power converter topology with main and/or auxiliary power switches Q1, Q2 being depletion mode switches such as group III-V compound semiconductor depletion mode switches, formed using principles and methods of the present invention. A controller of a control circuit controls the main and auxiliary power switches Q1, Q2 by providing a drive signal to a control terminal (e.g., a gate terminal) thereof as a function of a characteristic such as an output voltage Vout of the power converter. The control circuit also includes exemplary first and second dc offset circuits DOC1, DOC2 coupled between the controller and the main and auxiliary power switches Q1, Q2. The first dc offset circuit DOC1 includes a resistor R1 series coupled to a parallel combination of a capacitor C3 and a zener diode D3, which provides a bias voltage in conjunction with a protection circuit to provide a drive signal having a substantially non-zero value such as a negative value to the gate terminal to substantially disable the main power switch Q1. The second dc offset circuit DOC2 includes a resistor R2 series coupled to a parallel combination of a capacitor C4 and a zener diode D4, which provides a bias voltage in conjunction with a protection circuit to provide a drive signal having a substantially non-zero value such as a negative value to the gate terminal to substantially disable the auxiliary power switch Q2.

Commercially available pulse-width modulators or driver integrated circuits are typically designed to provide a positive voltage to turn on a switch, and zero volts (or substantially zero volts) to turn the switch off. With the control circuit of FIG. 22, a positive voltage (a drive signal in the form of a drive voltage) from the controller via the capacitor C4 and the zener diode D4 of the second dc offset circuit DOC2 causes the auxiliary power switch Q2 to turn on. The zener diode D4 allows the creation of a dc voltage on the capacitor C4. When the drive voltage transitions low, the charge stored on capacitor C4 applies a drive signal having a negative value (e.g., a negative gate-to-source voltage) to the gate terminal of the auxiliary power switch Q2, thereby turning it off. The same principle applies regarding the control of the main switch Q1 with the addition of a level shifter in the path between the controller and the main power switch Q1. An example of a level shifter is provided in a data sheet FN9159.6 for ISL6612A, ISL6613A, Advanced Synchronous Rectified Buck MOSFET Drivers with Pre-POR OVP, provided by Intersil Americas Inc., Jul. 27, 2006, which is incorporated herein by reference.

By sizing the capacitance value of the capacitor C4 to be substantially greater than the input capacitance of the auxiliary power switch Q2, the capacitor C4 can maintain the auxiliary power switch Q2 off for an extended period of time. The resistors R1, R2 associated with the first and second dc offset circuits DOC1, DOC2 may be used to control overshoot and voltage ringing at the gate terminals for the main and auxiliary power switches Q1, Q2. The zener voltage of the zener diodes D3, D4 may be selected to position the dc offset of the control signals to the main power switch Q1 and the auxiliary power switch Q2 so that these switches are fully enabled to conduct and are fully turned off at the appropriate times of a switching cycle, as is well understood in the art.

One of the desirable attributes of using group III-IV compound semiconductor switches in a power converter is that the devices typically switch very fast (on the order of one nanosecond), and the gate capacitance and gate charge are very low compared to commonly available silicon-based switches. Therefore, the protection and control circuits can operate in a manner whereby the protection circuit pulses, for example, the auxiliary power switch Q2 on for a very brief period, long enough to build up charge on the capacitor C4. The protection circuit then uses the charge on the capacitor C4 to substantially disable conduction of the auxiliary power switch Q2 (sometimes referred to as a charge pump). Such a sufficiently brief "on" pulse such as an on pulse of several nanoseconds, typically will not result in a current level high enough to cause a problem in the control circuit. In addition, if the protection circuit disables conduction of the auxiliary power switch Q2 for an extended period of time, it could go into a refresh mode of operation, whereby the gate terminal of the auxiliary power switch Q2 is pulsed briefly as needed to maintain a charge on the capacitor C4.

The protection circuit may include circuitry capable of running at a very low voltage, such that the protection circuit may substantially disable conduction of the main and auxiliary power switches Q1, Q2 on the fly, for example, as the input voltage Vin increases. Alternatively, the protection circuit may employ a bias supply to assist in disabling a conduction of the main and auxiliary power switches Q1, Q2 prior to the input voltage Vin increasing. The remaining elements of the power converter are analogous to like elements illustrated and described with respect to FIG. 21 and, in the interest of brevity, will not be redescribed.

Thus, a semiconductor device including a vertical FET has been introduced. The vertical FET is formed with a source contact formed on a substrate and a drain contact formed on an opposing surface of the device to provide a low on-resistance switch with very fast switching transition times. A metallized gate controls a vertical channel therein. While the illustrated embodiments introduced a source contact coupled to a bottom or lower surface of a substrate and a drain contact on an opposing surface of the device, those skilled in the art understand that the contacts may be reversed and still fall within the broad scope of the present invention. A Schottky diode formed on the same die as the vertical FET has been introduced. A power converter including a vertical FET formed with these characteristics has also been introduced.

Those skilled in the art should understand that the previously described embodiments of the semiconductor device and related methods of forming the same are submitted for illustrative purposes only. In addition, other embodiments capable of providing the advantages as described above are well within the broad scope of the present invention. While the semiconductor device provides advantages in the environment of a power supply, other applications therefor are well within the broad scope of the present invention.

For a better understanding of power electronics, see "Principles of Power Electronics," by J. G. Kassakian, M. F. Schlecht and G. C. Verghese, Addison-Wesley (1991). For a better understanding of semiconductor devices and processes, see "Fundamentals of III-V Devices," by William Liu, John Wiley and Sons, (1999). For a better understanding of gallium arsenide processing, see "Modern GaAs Processing Methods," by Ralph Williams, Artech House, Second Ed. (1990). The aforementioned references are incorporated herein by reference.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof, to form the devices providing reduced on-resistance, gate drive energy, and costs as described herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. Additionally, the terms "above," "formed over" or other similar terminology employed in reference to the semiconductor device or method of forming the same shall not be limited to "directly above" or "directly formed over" and, unless otherwise specified, the scope of the present invention contemplates that intervening layers may be present when characterizing a layer above, over, formed over, etc. another layer.

What is claimed is:

1. A method of forming a semiconductor device, comprising:
    forming a vertical field-effect transistor, including:
        forming a heavily doped substrate,
        forming a channel layer above said heavily doped substrate,
        forming a heavily doped source/drain layer above said channel layer,
        forming a source/drain contact above said heavily doped source/drain layer,
        patterning and etching pillar regions through said source/drain contact, said heavily doped source/drain layer, and portions of said channel layer to form a vertical cell,
        forming non-conductive regions in said portions of said channel layer within said pillar regions, and
        forming a gate above said non-conductive regions in said pillar regions; and
    forming a Schottky diode, including:
        forming a trench through said heavily doped substrate to said channel layer outside of said vertical cell and said pillar regions, and
        forming a contact below said heavily doped substrate within said vertical cell and pillar regions and within said trench, said contact within said vertical cell and pillar regions providing another source/drain contact for said vertical field-effect transistor, said contact within said trench providing an anode configured to cooperate with said channel layer that provides a cathode for said Schottky diode.

2. The method as recited in claim 1 wherein forming said vertical field-effect transistor further includes forming a heavily doped buffer layer on an upper surface of said heavily doped substrate before forming said channel layer.

3. The method as recited in claim 1 wherein forming said vertical field-effect transistor further includes forming a heavily doped buffer layer and an etch stop layer on an upper surface of said heavily doped substrate before forming said channel layer and forming said Schottky diode further includes forming a trench through said heavily doped substrate, said heavily doped buffer layer and said etch stop layer to said channel layer outside of said vertical cell and said pillar regions.

4. The method as recited in claim 1 wherein said source/drain contact is formed from an alloy including gold, germanium and nickel and said gate is formed with platinum.

5. The method as recited in claim 1 wherein said heavily doped substrate is n-doped with silicon.

6. The method as recited in claim 1 wherein said channel layer is n-doped with silicon.

7. The method as recited in claim 1 wherein forming said vertical field-effect transistor further includes:
    forming a conformal dielectric layer across an upper surface of said semiconductor device and selectively removing portions thereof to form sidewall spacers within said pillar regions before forming said non-conductive regions; and
    performing a wet etch on exposed surfaces of said semiconductor device to form undercut regions under said sidewall spacers before forming said non-conductive regions.

8. The method as recited in claim 1 wherein said heavily doped substrate forms a source, said another source/drain contact forms a source contact, said heavily doped source/drain layer forms a drain and said source/drain contact forms a drain contact of said vertical field-effect transistor.

9. The method as recited in claim 1 wherein a doping density or a thickness of said channel layer is limited to form said vertical field-effect transistor as an enhancement mode device.

10. The method as recited in claim 1 wherein said contact is formed with platinum.

11. A semiconductor device, comprising:
    a vertical field-effect transistor, including:
        a heavily doped substrate,
        a channel layer above said heavily doped substrate,
        a heavily doped source/drain layer above said channel layer,
        a source/drain contact above said heavily doped source/drain layer,
        pillar regions including said source/drain contact, said heavily doped source/drain layer, and portions of said channel layer to form a vertical cell therebetween,
        non-conductive regions in said portions of said channel layer within said pillar regions, and
        a gate above said non-conductive regions in said pillar regions; and
    a Schottky diode, including:
        a contact below said heavily doped substrate within said vertical cell and pillar regions and within a trench through said heavily doped substrate to said channel layer outside of said vertical cell and said pillar regions, said contact within said vertical cell and pillar regions providing another source/drain contact for said vertical field-effect transistor, said contact within said trench providing an anode configured to cooperate with said channel layer that provides a cathode for said Schottky diode.

12. The semiconductor device as recited in claim 11 wherein said vertical field-effect transistor further includes a heavily doped buffer layer between said heavily doped substrate and said channel layer.

13. The semiconductor device as recited in claim 11 wherein said vertical field-effect transistor further includes a heavily doped buffer layer and an etch stop layer between said heavily doped substrate and said channel layer and said Schottky diode further includes a trench through said heavily doped substrate, said heavily doped buffer layer and said etch stop layer to said channel layer outside of said vertical cell and said pillar regions.

14. The semiconductor device as recited in claim 11 wherein said source/drain contact is formed from an alloy including gold, germanium and nickel and said gate is formed with platinum.

15. The semiconductor device as recited in claim 11 wherein said heavily doped substrate is n-doped with silicon.

16. The semiconductor device as recited in claim 11 wherein said channel layer is n-doped with silicon.

17. The semiconductor device as recited in claim 11 wherein said vertical field-effect transistor further includes sidewall spacers on opposing sides of said vertical cell within said pillar regions, said gate being partially recessed in undercut regions under said sidewall spacers.

18. The semiconductor device as recited in claim 11 wherein said heavily doped substrate forms a source, said another source/drain contact forms a source contact, said heavily doped source/drain layer forms a drain and said source/drain contact forms a drain contact of said vertical field-effect transistor.

19. The semiconductor device as recited in claim 11 wherein a doping density or a thickness of said channel layer is limited to form said vertical field-effect transistor as an enhancement mode device.

20. The semiconductor device as recited in claim 11 wherein said contact is formed with platinum.

21. A power converter coupled to a source of electrical power and configured to provide a regulated output characteristic, comprising:
a semiconductor device, including:
a power switch formed as a vertical field-effect transistor, including:
a heavily doped substrate,
a channel layer above said heavily doped substrate,
a heavily doped source/drain layer above said channel layer,
a source/drain contact above said heavily doped source/drain layer,
pillar regions including said source/drain contact, said heavily doped source/drain layer, and portions of said channel layer to form a vertical cell therebetween,
non-conductive regions in said portions of said channel layer within said pillar regions, and
a gate above said non-conductive regions in said pillar regions, and
a Schottky diode, including:
a contact below said heavily doped substrate within said vertical cell and pillar regions and within a trench through said heavily doped substrate to said channel layer outside of said vertical cell and said pillar regions, said contact within said vertical cell and pillar regions providing another source/drain contact for said vertical field-effect transistor, said contact within said trench providing an anode configured to cooperate with said channel layer that provides a cathode for said Schottky diode;
a controller configured to control conduction intervals of said power switch to provide said regulated output characteristic; and
an output filter coupled to said power switch to filter said output characteristic.

22. The power converter as recited in claim 21 wherein said vertical field-effect transistor further includes a heavily doped buffer layer between said heavily doped substrate and said channel layer.

23. The power converter as recited in claim 21 wherein said vertical field-effect transistor further includes a heavily doped buffer layer and an etch stop layer between said heavily doped substrate and said channel layer and said Schottky diode further includes a trench through said heavily doped substrate, said heavily doped buffer layer and said etch stop layer to said channel layer outside of said vertical cell and said pillar regions.

24. The power converter as recited in claim 21 wherein said source/drain contact is formed from an alloy including gold, germanium and nickel and said gate is formed with platinum.

25. The power converter as recited in claim 21 wherein said heavily doped substrate is n-doped with silicon.

26. The power converter as recited in claim 21 wherein said channel layer is n-doped with silicon.

27. The power converter as recited in claim 21 wherein said vertical field-effect transistor further includes sidewall spacers on opposing sides of said vertical cell within said pillar regions, said gate being partially recessed in undercut regions under said sidewall spacers.

28. The power converter as recited in claim 21 wherein said heavily doped substrate forms a source, said another source/drain contact forms a source contact, said heavily doped source/drain layer forms a drain and said source/drain contact forms a drain contact of said vertical field-effect transistor.

29. The power converter as recited in claim 21 wherein a doping density or a thickness of said channel layer is limited to form said vertical field-effect transistor as an enhancement mode device.

30. The power converter as recited in claim 21 wherein said contact is formed with platinum.

* * * * *

UNITED STATES PATENT AND TRADEMARK OFFICE
CERTIFICATE OF CORRECTION

PATENT NO. : 7,541,640 B2
APPLICATION NO. : 11/765324
DATED : June 2, 2009
INVENTOR(S) : Brar et al.

Page 1 of 1

It is certified that error appears in the above-identified patent and that said Letters Patent is hereby corrected as shown below:

On the Title Page, Section (56) References Cited, OTHER PUBLICATIONS, Page 2, Col. 2, 7$^{th}$ entry, delete "Lui" and insert --Liu--.
In Col. 7, line 28, delete "source/train" and insert --source/drain--.
In Col. 12, line 46, before an delete "the".

Signed and Sealed this

Eighteenth Day of August, 2009

David J. Kappos
*Director of the United States Patent and Trademark Office*